(12) United States Patent
Kim et al.

(10) Patent No.: US 11,573,792 B2
(45) Date of Patent: Feb. 7, 2023

(54) METHOD AND COMPUTING DEVICE WITH A MULTIPLIER-ACCUMULATOR CIRCUIT

(71) Applicant: SAMSUNG ELECTRONICS CO., LTD., Suwon-si (KR)

(72) Inventors: Sang Joon Kim, Hwaseong-si (KR); Seungchul Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 293 days.

(21) Appl. No.: 16/987,863

(22) Filed: Aug. 7, 2020

(65) Prior Publication Data

US 2021/0064367 A1  Mar. 4, 2021

(30) Foreign Application Priority Data

Sep. 3, 2019  (KR) .......... 10-2019-0109173
Apr. 16, 2020  (KR) .......... 10-2020-0046244

(51) Int. Cl.
*G06F 9/30* (2018.01)
*G04F 10/00* (2006.01)
*H03K 21/08* (2006.01)

(52) U.S. Cl.
CPC .......... *G06F 9/3001* (2013.01); *G04F 10/005* (2013.01); *H03K 21/08* (2013.01)

(58) Field of Classification Search
CPC ...... G06F 9/3001; G04F 10/005; H03K 21/08
USPC ...................................................... 708/190
See application file for complete search history.

(56) References Cited

U.S. PATENT DOCUMENTS

| | | |
|---|---|---|
| 2005/0138100 A1 | 6/2005 | Nomura et al. |
| 2013/0127774 A1 | 5/2013 | Hong et al. |
| 2015/0074028 A1 | 3/2015 | Miyashita |
| 2017/0364791 A1 | 12/2017 | Miyashita et al. |
| 2018/0253643 A1 | 9/2018 | Buchanan et al. |
| 2019/0042160 A1* | 2/2019 | Kumar ............... G06F 3/0659 |
| 2019/0042199 A1 | 2/2019 | Sumbul et al. |
| 2019/0042949 A1 | 2/2019 | Young et al. |
| 2019/0080231 A1 | 3/2019 | Nestler et al. |
| 2019/0171418 A1 | 6/2019 | Morie et al. |

FOREIGN PATENT DOCUMENTS

CN  109344964 A  2/2019

OTHER PUBLICATIONS

Extended European Search Report dated Jan. 25, 2021 in counterpart European Patent Application No. 20193761.2 (7 pages in English).

* cited by examiner

*Primary Examiner* — Tomi Skibinski
(74) *Attorney, Agent, or Firm* — NSIP Law

(57) ABSTRACT

Provided is a multiplier-accumulator (MAC) system, circuit, and method. The MAC system includes a MAC circuit, including a plurality of resistors, having respective resistances, a capacitor connected to the plurality of resistors to charge, in response to a plurality of input signals, the capacitor with electric charge, and a time-to-digital converter (TDC) configured to convert information of a charge time of the capacitor, due to the electric charge, into a digital value, wherein the digital value is an accumulation result of the MAC circuit.

39 Claims, 14 Drawing Sheets

METHOD AND COMPUTING DEVICE WITH A MULTIPLIER-ACCUMULATOR CIRCUIT

CROSS-REFERENCE TO RELATED APPLICATIONS

This application claims the benefit under 35 USC § 119(a) of Korean Patent Application No. 10-2019-0109173 filed on Sep. 3, 2019, and Korean Patent Application No. 10-2020-0046244 filed on Apr. 16, 2020, in the Korean Intellectual Property Office, the entire disclosures of which are incorporated herein by reference for all purposes.

BACKGROUND

1. Field

The following description relates to technology for a multiplier-accumulator (MAC) circuit, computing devices, and methods.

2. Description of Related Art

A vector matrix multiplication operation, also known as a multiply and accumulate (MAC) operation, influences the performance of devices in various fields. For example, the MAC operation may be performed in a machine learning and authentication operation of a device, for a neural network including multiple layers. An input signal may be considered as forming an input vector, e.g., representing data for images, bytestreams, or other data sets. In such a neural network example, the input signal may be multiplied by respective weights, an output vector may be obtained from the result of accumulation operation with respect to the multiplication, and the output vector may be provided as an input vector for a subsequent layer of the neural network. Since the MAC operation as above is repeated for multiple layers, the neural network processing performance may be significantly determined by the performance of the MAC operation.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a multiplier-accumulator (MAC) system includes a MAC circuit that includes a plurality of resistors, having respective resistances, a capacitor connected to the plurality of resistors to charge, in response to a plurality of input signals, the capacitor with electric charge, and a time-to-digital converter (TDC) configured to convert information of a charge time of the capacitor, due to the electric charge, into a digital value, wherein the digital value may be an accumulation result of the MAC circuit.

The plurality of resistors and the capacitor may be configured as a first output line, the MAC circuit may further include one or more other output lines, each respectively including respective plural resistors, having respective resistances, connected to a respective other capacitor, the respective other capacitor, of each of the one or more other output lines, may be configured to be charged, in response to the plurality of input signals, with respective electric charge, and the respective other capacitor and the capacitor may have a same capacitance.

The time-to-digital converter (TDC) may be configured to convert respective information of respective charge times of the respective other capacitor of the one or more other output lines, into respective digital values, and the digital value and the respective digital values may be the accumulation results of the MAC circuit.

The first output line may further include a comparator connected to the capacitor and may be configured to generate the information of the charge time of the capacitor, and the other output lines may each further include respective other comparators, each of the respective other comparators being respectively connected to the respective other capacitor of the one or more other output lines and configured to generate the respective information of the respective charge times.

The information of the charge time of the capacitor may be an indication of a time instant at which the comparator outputs a comparison result, and the respective information of the respective charge times may each be respective indications of the time instances at which the respective other comparators output their respective comparison results.

The TDC may include a counter configured to generate a count output, the conversion to the digital value may be dependent on a corresponding counted output of the counter at a time corresponding to the time instant at which the comparator outputs the comparison result, and the conversions to the respective digital values may be respectively dependent on correspondingly counted outputs of the counter at times corresponding to the time instances at which the respective other comparators individually output their respective comparison results.

The comparator may be configured to output the comparison result in response to a voltage of the capacitor meeting a reference threshold, and the respective other comparators may each be configured to individually output their respective comparison results in response to respective voltages of the respective other capacitor of the one or more other output lines meeting the reference voltage.

The comparator may be configured to output the comparison result in response to a voltage of the capacitor meeting a reference threshold, and the respective other comparators may each be configured to individually output their respective comparison results in response to respective voltages of the respective other capacitor of the one or more other output lines meeting the reference voltage.

The system may include a computing device that includes the MAC circuit, the plurality of input signals may be an input to a neural network layer, of the MAC system, as bits of an input or as multi-bit states of respective inputs, and the respective resistances and the other resistances may represent at least a parameter of the neural network layer.

The plurality of input signals may be received by the MAC circuit as a series of input voltage signals that are respectively provided to a plurality of input lines of the MAC circuit, and as a first input line of the plurality of input lines, a voltage corresponding to one of the plurality of input signals may be provided to one of the plurality of resistors of the first output line, and to one of the respective plural resistors of another output line of the one or more output lines. Also, as a second input line of the plurality of input lines, a voltage corresponding to different one of the plurality of input signals may be provided to a different one of the plurality of resistors of the first output line, and to a different one of the respective plural resistors of the other output line.

The MAC circuit may further include a comparator connected to the plurality of resistors and the capacitor and configured to output a comparison result obtained by comparing a target voltage, corresponding to an amount of electric charge in the capacitor, to a reference voltage, and the TDC may be configured to perform the conversion based on the comparison result of the comparator.

The information of the charge time of the capacitor may include information indicating a time instant at which the comparison result is output.

The comparator may be configured to output the comparison result, in response to the target voltage exceeding the reference voltage as the capacitor is charged dependent on one or more of the plurality of input signals.

The plurality of input signals may be received by the MAC circuit as a series of input voltage signals that are respectively provided to a plurality of input lines of the MAC circuit.

The plurality of resistors may be connected to each other in parallel, and one end of each of the plurality of resistors may be configured to receive a voltage through a switch, and another end of each of the plurality of resistors may be connected to the capacitor and a comparator, wherein the information of the charge time of the capacitor may be dependent on operation of the comparator.

One or more resistors of the plurality of resistors may form a composite resistance, and the TDC may be configured to convert the information of the charge time into the digital value, where the charge time of the capacitor may be dependent on a combination of the composite resistance and a capacitance of the capacitor.

The plurality of resistors and the capacitor may be configured as a first output line, and the information of the charge time of the capacitor may be a time having elapsed, from a start time instant at which the plurality of input signals are received, to an output time instant at which a comparison result of the first output line is output.

The TDC may further include a single global counter configured to output a value indicating the time having elapsed from the start time instant, and a referrer configured to refer to the output value of the single global counter at the output time instant.

The plurality of resistors and capacitor may be configured as a first output line, of a plurality of output lines of the MAC circuit, that may further include a comparator to provide the information of the charge time of the capacitor, the MAC circuit may further include one or more other output lines of the plurality of output lines, each respectively including respective plural resistors, having respective resistances, and a respective other capacitor, each of the other output lines including a corresponding other comparator that respectively provides information of charge times of the respective other capacitor, the referrer may include a hold circuit configured to refer to a comparison result of the comparator, and a plurality of other hold circuits configured to respectively refer to other comparison results of the respective other comparators, and each of the hold circuit and the plurality of other hold circuits may be configured to respectively refer to output values of the single global counter at a time instant corresponding to the referred to comparison result and the respectively referred to other comparison results.

Each of the hold circuit and the plurality of other hold circuits may be configured as a flip-flop circuit.

The respective resistances may be set to respectively represent a connection weight of an edge, connecting a plurality of nodes, in a neural network of the MAC system.

The plurality of resistors and the capacitor may be configured as a first output line of a plurality of output lines, the MAC circuit may further include one or more other output lines, of the plurality of output lines, each respectively including respective plural resistors, having respective resistances, and a respective other capacitor, and the MAC circuit may further include an output stage configured to output respective values mapped to digital values generated by the TDC as output values of each of the plurality of output lines.

The plurality of resistors and the capacitor may be configured as a first output line, and the MAC circuit may be configured to discharge the capacitor to a threshold voltage or lower until a subsequent plurality of input signals are received after all digital output values of the TDC are output for all output lines of the MAC circuit with respect to the plurality of input signals.

The MAC circuit may be configured to reset a count of a single global counter, used by the TDC for the conversion, in response to a start signal corresponding to receipt of the plurality of input signals.

The MAC circuit may be configured to apply each of the plurality of input signals to a respective resistor, of the plurality of resistors, corresponding to respective input lines indicated by input data including the plurality of input signals, in response to a start signal, and the TDC may be configured to start counting a time having elapsed in response to the start signal.

The MAC circuit may further include a switch connected to a select one of the plurality of resistors and configured to transfer an input voltage signal according to an input signal, of the plurality of input signals, to the select one resistor upon receipt of a start signal in response to input data, including the plurality of input signals, indicating an select input line, of a plurality of input lines, that includes the select one resistor.

The plurality of input signals may be respectively provided to a plurality of input lines of the MAC circuit, each including a corresponding resistor of the plurality of resistors, and the MAC circuit may further include a switch respectively connected to one end of each of the plurality of resistors, wherein the switch may be configured to transfer a supply voltage to the corresponding resistor, in response to a corresponding input signal of the plurality of input signals being a close signal, and configured to open one end of the corresponding resistor, in response to the corresponding input signal being an open signal.

Each of the switches may be a MOSFET transistor, with the corresponding input signal connecting to a gate of the MOSFET transistor.

The MAC circuit may further include a switch connected to a select one of the plurality of resistors and configured to apply a supply voltage to the select one resistor in response to an input signal, of the plurality of input signals, during a charging period of the capacitor.

The switch may be configured to apply a reset voltage to the select one resistor in response to the input signal during a discharging period of the capacitor, and the MAC circuit may further include a comparator configured to output a comparison result in response to a target voltage of the capacitor exceeding a first reference voltage while the capacitor is charged with the electric charge by the supply voltage, wherein the target voltage corresponds to the electric charge, and configured to output another comparison result in response to the target voltage being less than a second reference voltage while the electric charge is discharged from the capacitor by the reset voltage.

The system may include a computing device, with the MAC circuit included in the computing device.

In one general aspect, a multiplier-accumulator (MAC) computing device includes one or more MAC circuits, respectively including a memory array including a plurality of input lines respectively interfacing with a plurality of output lines, where each of the output lines includes a respective capacitor configured to be charged or discharged in response to input signals respectively provided to two or more of the plurality of input lines, and a time-to-digital converter (TDC) including a single global counter configured to generate respective output values indicating times having elapsed from a start time instant, the TDC being configured to determine select outputs, from the respective output values, at times corresponding to respective charge or discharge times of the respective capacitor with respect to the charge or the discharge, and convert each of the determined select outputs into respective digital value results of the MAC circuit for the output lines.

The input signals may be respective inputs to a neural network layer, of a neural network of the computing device, as bits of an input or as multi-bit states of respective inputs.

In one general aspect, a computing method performed by a multiplier-accumulator (MAC) circuit includes receiving an input signal, charging, with electric charge, a capacitor connected to a plurality of resistors, according to a respective voltage applied to the plurality of resistors in response to the input signal, and converting a charging time of the capacitor into a digital value dependent on the input signal, the plurality of resistors, and the capacitor.

Other features and aspects will be apparent from the following detailed description, the drawings, and the claims.

Figure 1:
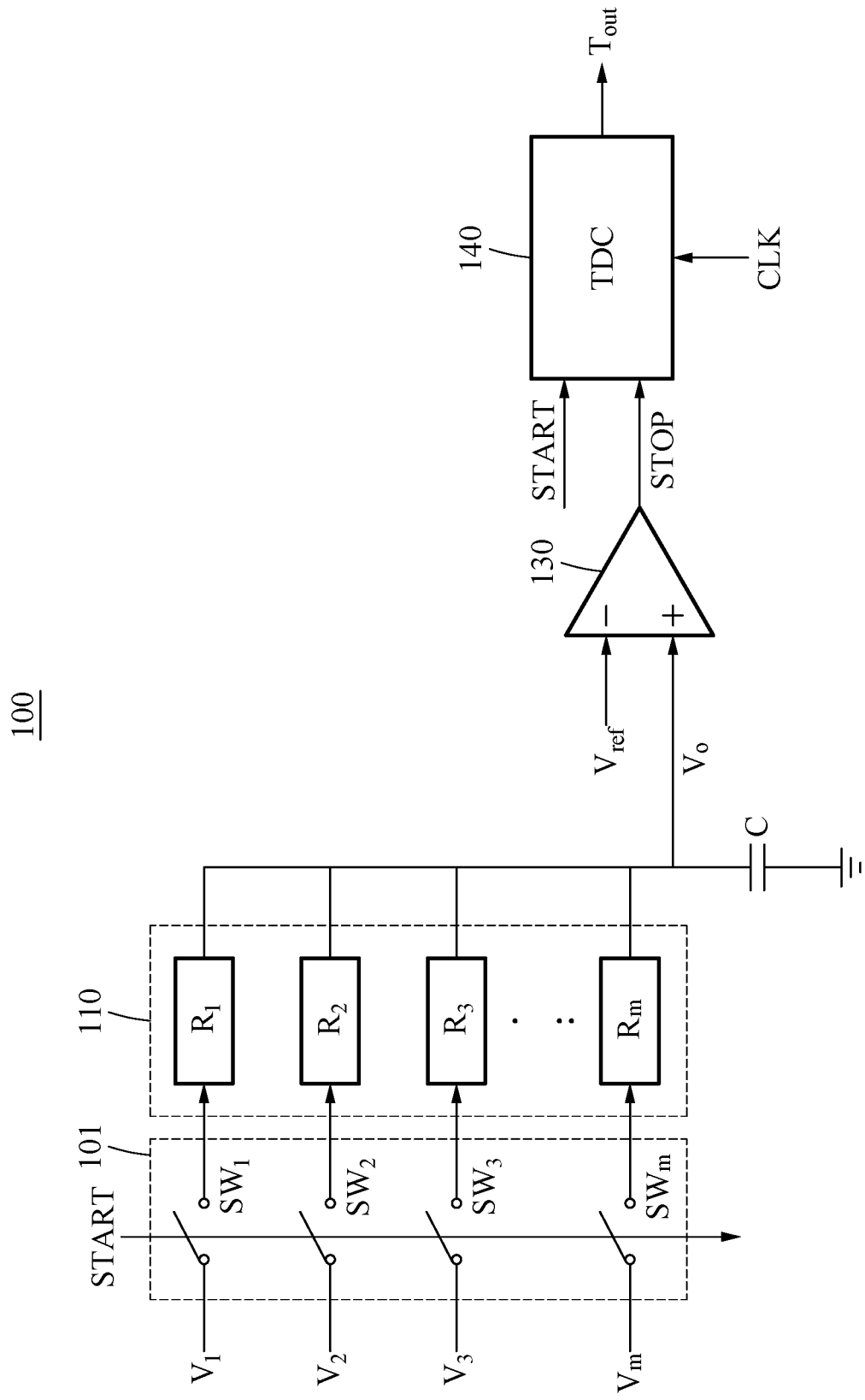
FIG. 1 illustrates an example of a multiplier-accumulator (MAC) circuit.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

Although terms of "first" or "second" are used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

As used herein, the singular forms are intended to include the plural forms as well, unless the context clearly indicates otherwise. The terminology used herein is for describing various examples only and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof. The use of the term "may" herein with respect to an example or embodiment (e.g., as to what an example or embodiment may include or implement) means that at least one example or embodiment exists where such a feature is included or implemented, while all examples are not limited thereto.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application, and are not to be interpreted in an idealized or overly formal sense unless expressly so defined herein.

Figure 2:
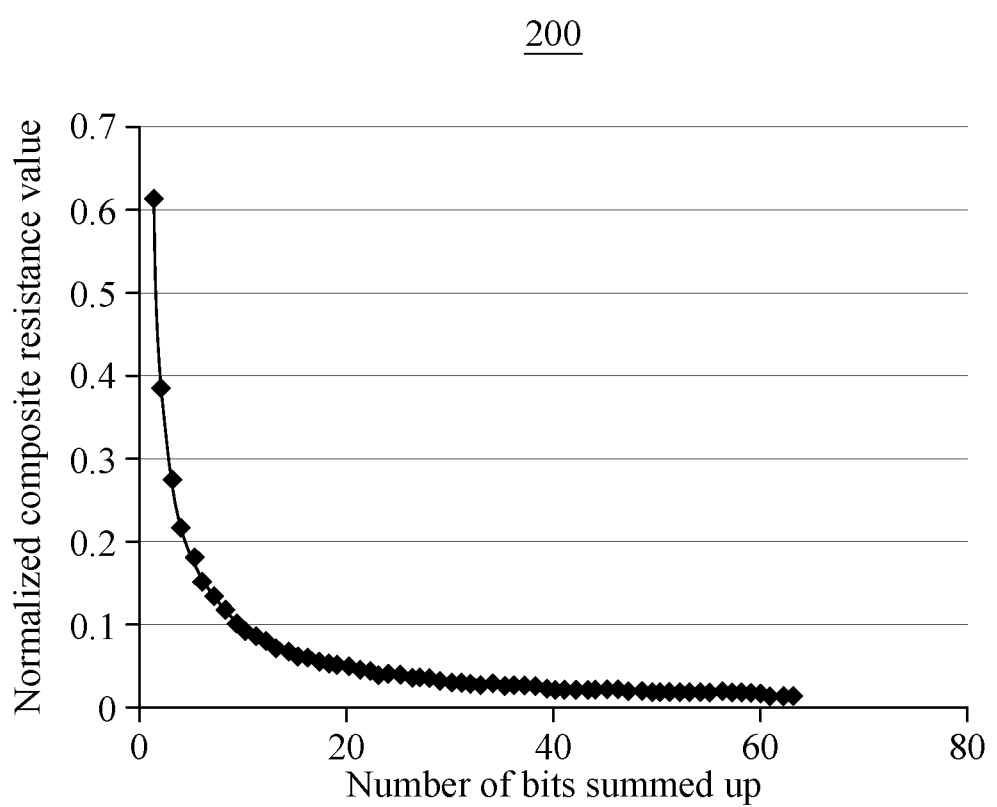
FIG. 2 illustrates an example of a mapping relationship between a composite resistance and an operation result in a MAC circuit.

FIG. 1 illustrates an example of a multiplier-accumulator (MAC) circuit. FIG. 2 illustrates an example of a mapping relationship between a composite resistance and an operation result in a MAC circuit, e.g., the MAC circuit of FIG. 1.

A MAC circuit 100 may be a circuit that outputs a cumulative value of multiplication results. The MAC circuit 100 may include a plurality of resistors 110, a capacitor C, and a time-to-digital converter (TDC) 140, for example. The MAC circuit 100 may include a comparator 130 to generate time information to be transmitted to the TDC 140.

A corresponding voltage may be applied to the plurality of resistors 110 in response to an input signal. The plurality of resistors 110 may be connected to each other in parallel, and resistors to which the voltage is applied may form a composite resistance. One end of each of the plurality of resistors 110 may receive a voltage through a switch, and the other end thereof may be connected to the capacitor C, e.g., one or more capacitors, and the comparator 130. Input voltage signals of the input signal may be applied directly to the plurality of resistors 110, or a supply voltage may be applied to the plurality of resistors 110 dependent on the input signal.

The plurality of resistors 110 connected to each other in parallel may form a composite resistance in response to the input signal, and the composite resistance value may correspond to a value of a multiply-accumulate result between input data and weight data. For example, among the plurality of resistors 110, resistors to which the voltage is applied may be involved in the formation of the composite resistance, and resistors to which the voltage is not applied may be excluded from the formation of the composite resistance. For example, a resistor to which the voltage is applied may represent a first resistance value (for example, 100 kiloohms) of the corresponding resistor, and a resistor to which the voltage is not applied may thereby represent a second resistance value (for example, 10 megaohms), which is sufficiently greater than the natural or set resistance value of the corresponding resistor since one end thereof is opened. When a resistor representing the first resistance value and a resistor representing the second resistance value are connected in parallel to form a composite resistance and the second resistance value is sufficiently greater than the first resistance value, the second resistance value may be substantially ignored in the composite resistance value, or the effect of the second resistance value on the composite resistance value may be little. Thus, resistors participating in the formation of the composite resistance may correspond to bitwise multiplication results of voltage values of input voltage signals and resistance values of the resistors, and when the voltage values of the input voltage signals are binary, the composite resistance value may correspond to a sum of bitwise multiplication results, for example. The composite resistance described above may be connected to the capacitor as shown in FIG. 1, and thus a time constant of the MAC circuit 100 may be determined by the composite resistance value and the capacitance. Since a charging time of the capacitor is determined by the time constant, the composite resistance value may be inferred from the charging time of the capacitor. Consequently, the sum of the bitwise multiplication results may be inferred from the charging time of the capacitor according to the time constant. An example of the charging time will be described in greater detail below in association with the operation of the comparator 130.

In addition, the composite resistance value is not limited in examples to indicating only the bitwise multiplication result. For example, when the voltage values of the input voltage signals are not binary but indicate multiple states (for example, multiple bits), the resistors participating in the formation of the composite resistance may correspond to multiplication results of the voltage values of the input voltage signals and the resistance values of the resistors, and the composite resistance value may correspond to the sum of multiplication results.

For reference, in FIG. 1, an example of applying the input voltage signals of the input signal to resistors in response to a start signal START is described. The MAC circuit 100 may further include a plurality of switches 101 individually connected to one ends of the plurality of resistors 110. For example, a first switch $SW_1$ may be connected to one end of a first resistor $R_1$, a j-th switch $SW_j$ may be connected to one end of a j-th resistor $R_j$, and an m-th switch $SW_m$ may be connected to one end of an m-th resistor $R_m$. Here, m may be an integer greater than or equal to "1", and j may be an integer between "1" and "m" inclusive. The other ends of the plurality of switches 101 may receive input voltage signals $V_1$ to $V_m$. For example, the other end of the j-th switch $SW_j$ may receive a j-th input voltage signal $V_j$.

The input signal is a signal corresponding to the input data and may include a series of input voltage signals $V_1$ to $V_m$ that are input into a plurality of input lines. For example, the j-th input voltage signal may be applied to the j-th resistor $R_j$ through the j-th switch $SW_j$ in response to a start signal START. However, the input voltage signals $V_1$ to $V_m$ are not always applied to all resistors, and depending on the input data, input voltage signals may be applied to a portion of the resistors but not to another portion of the resistors.

For example, in response to one of the input data indicating an input line including a resistor connected to a corresponding switch, the corresponding switch may transmit an input voltage signal according to the input data to the resistor connected to the switch when receiving a start signal (START). Conversely, when another one of the input data does not indicate a corresponding input line, a voltage may not be supplied to the resistor even when a switch of the input line is closed in response to receiving a start signal START, e.g., in a non-limiting example all switches may be closed upon receipt of the start signal START. Here, since the other one of the input data of the input signal does not include an input voltage signal to be applied to the corresponding input line, a voltage may not be supplied to the resistor of the corresponding input line. Thus, one end of the resistor of the corresponding input line may float and be excluded from the formation of the composite resistor. As described above, a resistor with one end opened represents a resistance value substantially greater than its own natural or set resistance value, or the natural or set resistance values of the other resistors that are provided corresponding input voltage signals, and thus this resistor with the effectively substantially high resistance may be ignored in the composite resistance value or have a little effect on the composite resistance.

The capacitor C may be connected to the plurality of resistors 110 and charged with electric charge in response to a voltage being applied. For example, the capacitor C may be charged with electric charge by respective current flowing through the plurality of resistors 110 to which the voltage is applied through the input voltage signals or through switching. In FIG. 1, an example of charging the capacitor C with electric charge through the input voltage signals applied to the plurality of resistors 110 is described.

The comparator 130 may be connected to the plurality of resistors 110 and the capacitor C. The comparator 130 may output a comparison result obtained by comparing a target voltage $V_o$ corresponding to an amount of electric charge in the capacitor C to a reference voltage $V_{ref}$. In an example the comparator 130 may be configured as an operational amplifier (OP amp), and the other ends of the plurality of resistors 110 and one end of the capacitor C may be connected to one input node of the operational amplifier. The other input node of the operational amplifier may receive the reference voltage $V_{ref}$. The target voltage $V_o$ is a voltage corresponding to the amount of electric charge in the capacitor C, and may change over time according to a time constant determined by the capacitance of the capacitor C and the composite resistance formed by the input signal and the plurality of resistors 110. The reference voltage $V_{ref}$ may be a voltage that is a criterion for measuring a voltage change time (for example, a charging time or a discharging time). For example, in response to the target voltage $V_o$ exceeding the reference voltage $V_{ref}$ as the capacitor C is charged by the voltage according to the input signal, the comparator 130 may output the comparison result. In FIG. 1, the comparison result may indicate that the target voltage $V_o$ exceeds the reference voltage $V_{ref}$, and a time instant at which the comparison result is output may be referred to as an output time instant. The comparator 130 may generate a count end signal STOP as the comparison result.

The TDC 140 may convert, into a digital value, the charging time of the capacitor C according to a combination of the input signal, the plurality of resistors 110, and the capacitor C, as discussed. The TDC 140 may convert the charging time into the digital value based on the comparison result of the comparator 130. For example, the charging time may be a time difference between the output time instant at which the comparison result of the comparator 130 is output and a start time instant at which the start signal START was given. The time information is information indicating the charging time, and may be information indicating the number of clocks counted by a counter from the start time instant to the output time instant, which will be described in greater detail below with reference to FIGS. 4 and 5. Also, herein, references to clocks with respect to counting clocks may refer to the counting of clock cycles, or other forms of clock counting.

For reference, the plurality of resistors 110, the comparator 130, and the TDC 140 shown in FIG. 1 may correspond to one output line. In response to the start signal START, the MAC circuit 100 may apply the input voltage signals to the plurality of resistors 110. Among the plurality of resistors, resistors to which the input voltage signals are applied may form the composite resistance, as described above. In response to the input signal being applied, a natural response between these resistors and the capacitor C may increase the target voltage $V_o$ of the capacitor C. For example, the operation of the circuit including the resistors and the capacitor C after the start signal START is given may be expressed by Equation 1, for example.

$$\sum_j \frac{V_j - V_o}{R_j} = C \frac{dV_o}{dt} \qquad \text{Equation 1}$$

In Equation 1, j may denote be an integer between "1" and "m" inclusive. $V_j$ may be the j-th input voltage signal applied to the j-th input line, $R_j$ may be a resistance value for the j-th resistor disposed in the j-th input line, and C may be a capacitance value of the capacitor C. For reference, when the input data is an input bit sequence including a series of binary values, each of the plurality of input lines in the MAC circuit 100 may correspond to each bit position of the bit sequence. For example, when a bit value of the bit position is "1", an input voltage signal having a voltage value may be applied to an input line corresponding to the bit position. Conversely, when the bit value of the bit position is "0", an input voltage signal may not be applied to the input line corresponding to the bit position. Further, the resistance values of the plurality of resistors 110 may correspond to bit values multiplied by respective bits of the input bit sequence. For example, among the plurality of resistors 110, a resistor corresponding to a bit value of "1" has a first resistance value, and a resistor corresponding to a bit value of "0" has a second resistance value that is substantially greater than the first resistance value to not have a significant effect on the composite resistance value. As described above, in a composite resistance formed by the resistor having the first resistance value and the resistor having the second resistance value, the magnitude of the second resistance value substantially greater than the first resistance value may be ignored as having little or no significant effect on the composite resistance value.

A boundary condition with respect to Equation 1 described above may be expressed by Equation 2, for example.

$$V_o(0^+) = 0, \ V_o(\infty) = \sum_j \frac{V_j}{R_j} / \sum_j \frac{1}{R_j} \qquad \text{Equation 2}$$

In Equation 2, $V_o(0+)$ may be an initial value of the target voltage $V_o$, and $V_o(\infty)$ may be a convergence value of the target voltage $V_o$. The target voltage $V_o$ may be induced from Equation 1 and Equation 2, as expressed by Equation 3, for example.

$$V_o(t) = V_o(\infty)\left(1 - e^{-\frac{t}{R_o C}}\right) \qquad \text{Equation 3}$$

In Equation 3, the composite resistance $R_o$ is formed by resistors connected to each other in parallel, and a component value of the composite resistance may be expressed by Equation 4, for example.

$$R_o = 1 / \sum_j \frac{1}{R_j} \qquad \text{Equation 4}$$

In Equation 4, when the j-th resistor corresponds to a bit value of "0" or one end of the j-th resistor is opened (for example, when an input voltage signal is not applied to the j-th resistor), $R_j$ may effectively be the second resistance value greater than the first resistor value. When the j-th resistor corresponds to a bit value of "1" and an input voltage signal is applied to one end of the j-th resistor, $R_j$ may be the first resistance value.

When the target voltage $V_o$ of the capacitor C charged after the input signal is applied exceeds the preset reference voltage $V_{ref}$, the comparator 130 may output a count end signal STOP. Here, in relation to the charging time $T_{out}$ in which the target voltage $V_o$ becomes equal to the preset reference voltage $V_{ref}$, Equation 3 may be expressed as Equation 5, for example.

$$V_{ref} = V_o(\infty)\left(1 - e^{-\frac{T_{out}}{R_o C}}\right) \qquad \text{Equation 5}$$

Equation 5 may be rearranged with respect to the charging time $T_{out}$, as expressed by Equation 6, for example.

$$T_{out} = R_o C \cdot \ln\left(\frac{V_o(\infty)}{V_o(\infty) - V_{ref}}\right) \qquad \text{Equation 6}$$

As shown in Equation 6, the charging time $T_{out}$ may be a linear function of the composite resistance $R_o$ and may be proportional to the composite resistance $R_o$. As described above, an individual $R_j$ value forming the composite resistance $R_o$ may correspond to a bitwise multiplication result between a bit value of the input data and a bit value indicated by the resistor in the j-th input line. For example, when the bit value of "1" corresponds to a low resistance value (for example, 100 kiloohms) and the bit value of "0" corresponds to a high resistance value (for example, 10 megaohms), the composite resistance $R_o$ may represent an inversely proportional relationship as shown in a graph 200 of FIG. 2 according to the number of bits being "1" in the multiply-accumulate results. In the graph 200 of FIG. 2, the x-axis represents the number of bits being summed up as the number of resistors corresponding to the bit value of "1", and the y-axis represents the composite resistance value in which 100 kiloohms are normalized to "1". Based on the inversely proportional relationship, the MAC circuit may estimate the number of bits according to the bitwise multiplication result from the estimated composite resistance $R_o$.

In summary, the charging time $T_{out}$ may be proportional to the composite resistance $R_o$, and the composite resistance $R_o$ may be mapped to a multiply-accumulate result between values of, or indicated by, the plurality of resistors 110 and of the input data, as shown in the graph of FIG. 2. In a binary operation, the multiply-accumulate result may correspond only to the number of bit values of "1" used for summation.

As described above, the MAC circuit 100 may output a charging time $T_{out}$ corresponding to the multiply-accumulate result as a digital value. For example, the TDC 140 of the MAC circuit 100 may count a time difference (for example, a charging time) between the start signal START and the count end signal STOP as the number of reference clocks CLK and output the counted number of reference clocks CLK as the digital value.

The MAC circuit 100 may improve the data transmission rate and the power consumption over previous approaches, e.g., unlike the Von Neumann architecture in which a memory and an arithmetic unit are separated which accordingly limits multiply and accumulate operations to this required memory and arithmetic unit interaction. Further, the MAC circuit 100 may provide improved data transmission rate and power consumption, as well as use less area, compared to another previous approach that performs quantization into a digital signal using an analog-to-digital converter (ADC) and uses that signal as an input of an activation function in an in-memory computing architecture in which a memory and an arithmetic unit are integrated, as the MAC circuit 100 does not need to use independent ADCs in all columns as required with this previous approach.

For reference, in FIGS. 1 and 2 described above, the explanation was provided where the voltage value of the input voltage signal and the resistance value of the resistor have binary values, like a value corresponding to ON and a value corresponding to OFF. However, examples with respect to FIGS. 1 and 2, as well as other below explanations, are not limited thereto. The voltage value of the input voltage signal and the resistance value of the resistor may have values that are distinguished as multiple states. For example, when a 2-bit value is input into one input line, an input voltage signal may float with respect to "00", a first voltage value may be assigned to another input voltage signal with respect to "01", a second voltage value greater than the first voltage value may be assigned to the still another input voltage signal with respect to "10", and a third voltage value greater than the second voltage value may be assigned to a further input voltage value with respect to "11". When each resistor indicates a 2-bit value, a first resistance value may be assigned to the resistor with respect to "00", a second resistance value greater than the first resistance value may be assigned to the resistor with respect to "01", a third resistance value may be assigned to the resistor with respect to "10", and a fourth resistance value may be assigned to the resistor with respect to "11". The signal received in each input line and each resistor are not limited to indicating 2-bit multiple states but may indicate multiple states corresponding to more bits, or values according to a system other than the binary system may be assigned.

Figure 3:
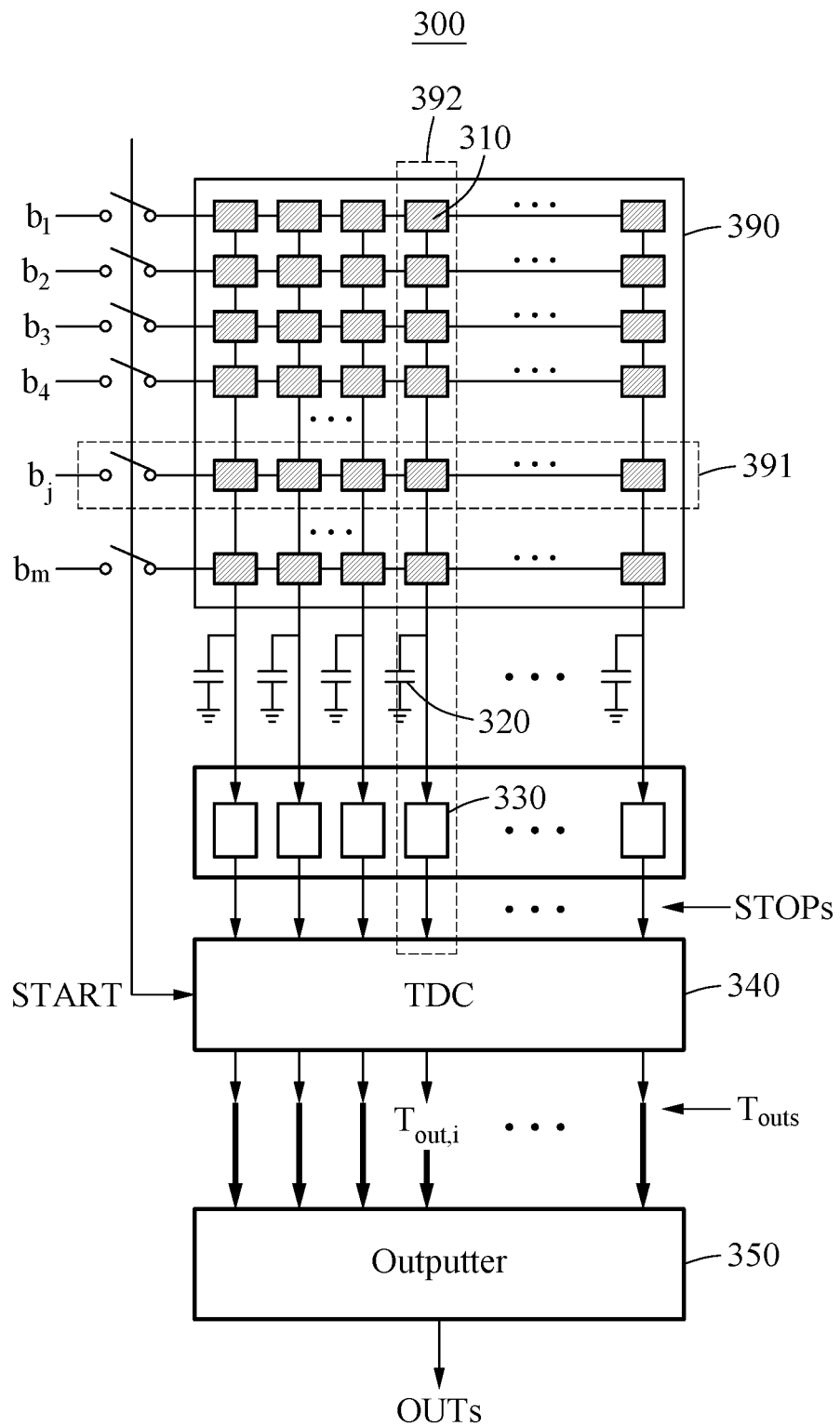
FIG. 3 illustrates an example of a MAC circuit including a plurality of input lines and a plurality of output lines.

FIG. 3 illustrates an example of a MAC circuit including a plurality of input lines and a plurality of output lines.

A MAC circuit 300 may include a plurality of input lines for individually receiving input signals and a plurality of output lines for individually outputting output signals, e.g., for a particular output line a particular $T_{out}$ may be determined and output. Each of the plurality of output lines may respectively include a plurality of resistors, a capacitor 320, and a comparator 330. Each of the plurality of input lines may intersect with the plurality of output lines. The MAC circuit 300 of FIG. 3 may include m input lines and n output lines. Although an input line and an output line are shown to perpendicularly intersect with each other, examples are not limited thereto. The MAC circuit 300 may include a plurality of resistors, a plurality of capacitors, a plurality of comparators, a single TDC 340, and an output stage 350.

As illustrated in FIG. 3, the plurality of resistors may be arranged along the plurality of output lines and the plurality of input lines. For example, a plurality of resistors may be disposed in each of the plurality of input lines along an output line. Each of these plurality of resistors may be configured to receive a voltage through an input line in which a corresponding resistor 310 is disposed, among the plurality of input lines. For example, resistors arranged along a j-th input line 391 may be configured to receive a j-th input voltage signal $b_j$ in response to a start signal. In FIG. 3, as an example, input voltage signals $b_1$ to $b_m$ may have voltages indicating binary values. For example, an input voltage signal indicating a bit value of "1" may indicate a determined voltage, and an input voltage signal indicating a bit value of "0" may indicate a floating voltage. A structure in which multiple resistors are arranged, with respect to such plural input voltage signals and plural output lines, may also be referred to as a memory array 390.

The plurality of capacitors may be individually disposed in each of the plurality of output lines. Each of the plurality of capacitors may be connected to the respective comparator 330 and the other end of the resistors disposed along an output line in which the corresponding capacitor 320 is disposed, among the plurality of output lines. Each of the plurality of capacitors may be charged with electric charge in response to the voltage received through the corresponding resistors. For example, a capacitor 320 disposed in an i-th output line 392 may be charged with electric charge according to the voltage applied to the resistors disposed in the i-th output line 392. For reference, the plurality of capacitors may have the same capacitance. This is because each output line should have the same scale of charging time or discharging time since the plurality of output lines share an output of a single global counter. The charging time and the discharging time may represent a scale proportional to a time constant corresponding to a composite resistance value and a capacitance.

The plurality of comparators may be individually disposed in the plurality of output lines, respectively. Each of the plurality of comparators may be connected to the capacitor 320 and the other end of the resistors arranged along the output line in which the corresponding comparator 330 is disposed, among the plurality of output lines, and output a result of comparing a target voltage of the corresponding capacitor 320 to a reference voltage. For example, a comparator 330 disposed in the i-th output line 392 may compare a target voltage of the capacitor 320 disposed in the i-th output line 392 to the reference voltage, and output an i-th count end signal $STOP_i$ in response to the target voltage exceeding the reference voltage.

The TDC 340 may receive count end signals for the plurality of output lines and convert respective time information into digital values. For example, the TDC 340 may individually output digital values corresponding to time information for the n output lines, respectively. The TDC 340 may output n digital values corresponding to the time information. For example, in response to the reception of the i-th count end signal $STOP_i$, the TDC 340 may generate i-th time information $T_{out,i}$ indicating a time difference between a start time instant corresponding to the start signal START and an output time instant corresponding to the count end signal $STOP_i$. The i-th time information $T_{out,i}$ may also be referred to as an i-th charging time.

The output stage 350 may output values mapped to the digital values generated by the TDC as output values OUTs of the output lines. As described above, the output values OUTs may be values in which the digital values indicating the time information are mapped to numbers corresponding to multiply-accumulate results. For example, the MAC circuit may output an i-th output value $OUT_i$ mapped to the i-th time information $T_{out,i}$ through a mapping table (for example, a look-up table). Since the output values are output respectively for the output lines, the output stage 350 may output n output values for the n output lines.

Hereinafter, the single global counter included in the TDC 340 will be described.

Figure 4:
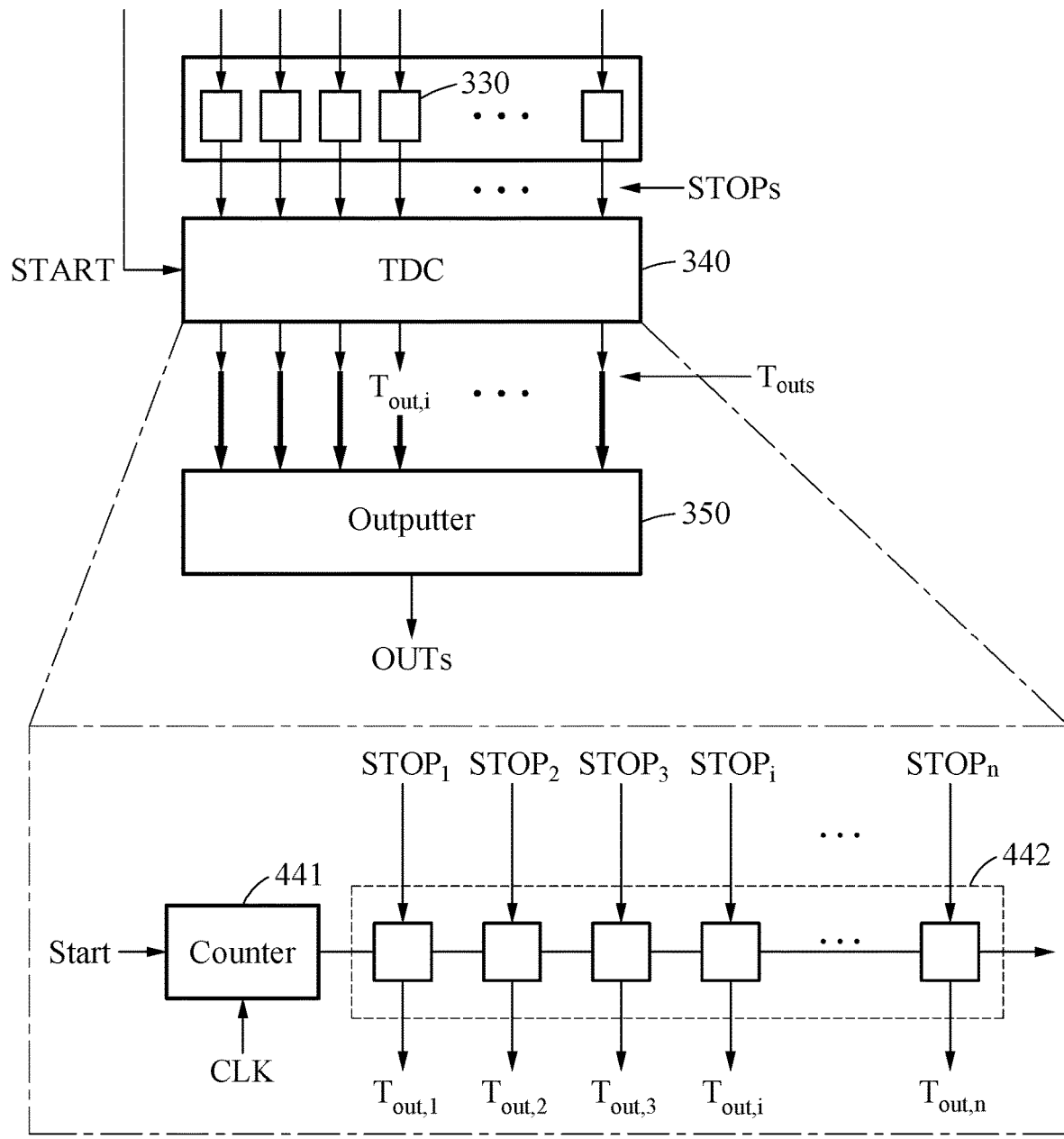
FIG. 4 illustrates an example of a time-to-digital converter (TDC).
Figure 5:
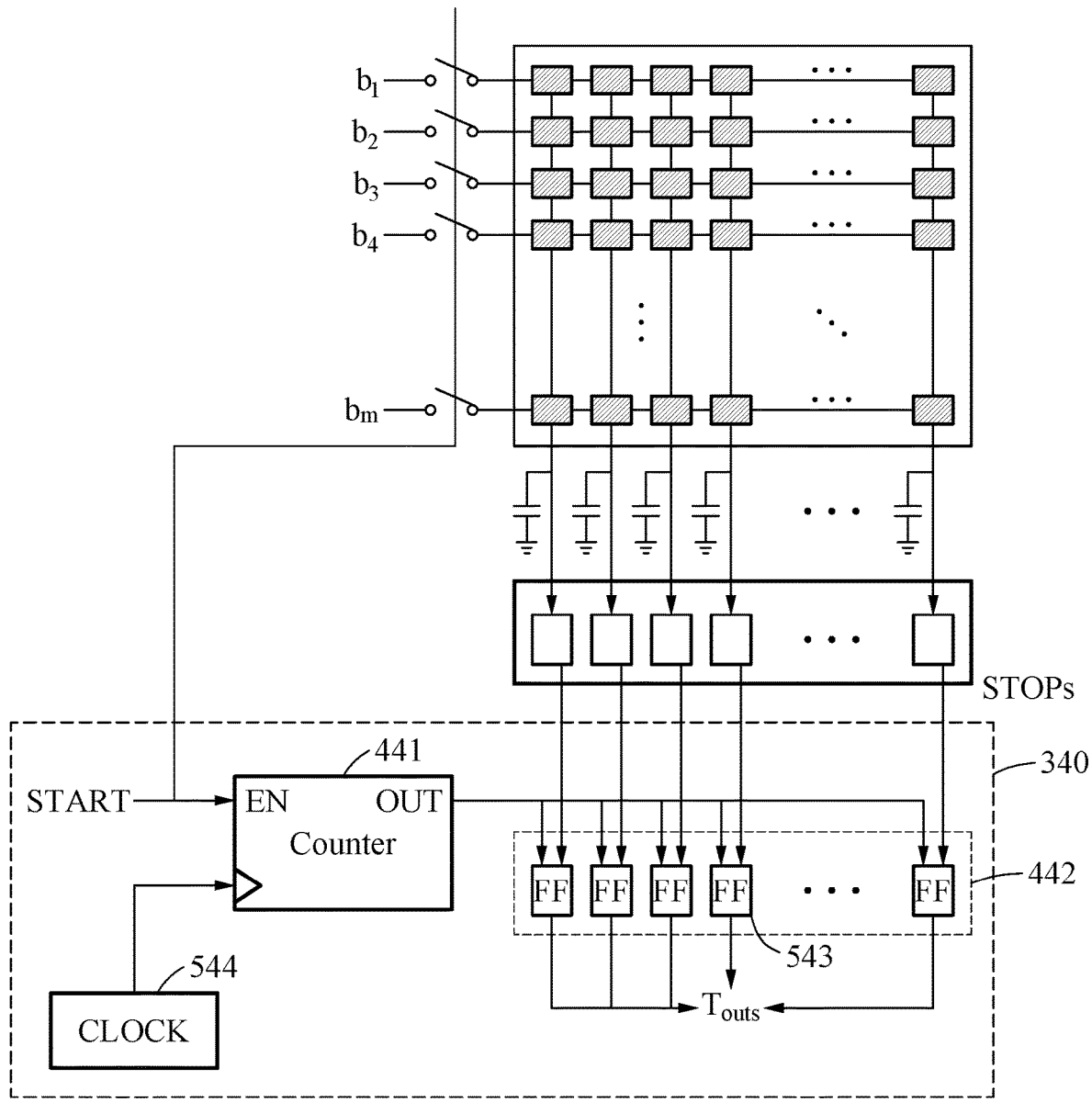
FIG. 5 illustrates an example of a referrer of a TDC.

FIG. 4 illustrates an example of a TDC. FIG. 5 illustrates an example of a referrer of a TDC.

For explanation purposes, and only as an example, The TDC of FIG. 4 may be the TDC 340 of FIG. 3, and may include a single global counter 441 and a referrer 442.

The single global counter 441 may output a digital value indicating the time elapsing from a start time instant. The single global counter 441 may be connected to the comparators of the plurality of output lines, such the plurality of output lines of FIG. 3. For example, the single global counter 441 may count the number of reference clocks CLK generated from a start time instant. Thus, no additional synchronization operation may be used and the single global counter 441 may count, for each individual output line, a corresponding time (for example, a charging time or a discharging time) elapsing based on the same start time instant in the unit of reference clocks (e.g., as respective clock cycles of a reference clock).

The referrer 442 may refer to, or observe, the digital values output from the single global counter 441 at each time instant at which the respective comparison results are output. The referrer 442 may include a plurality of hold circuits to refer to comparison results of the corresponding comparators of the plurality of output lines. Each of the plurality of hold circuits may refer to a same or different time instant at which a corresponding comparison result is output from a corresponding comparator included in a corresponding output line, among the plurality of output lines. For example, each hold circuit may hold the number of reference clocks CLK counted by the single global counter 441 at the output time instant at which a count end signal is received with respect to a corresponding comparator. The number of reference clocks CLK held at the respective output time instants by the respective hold circuits may correspond to time information (for example, the charging time or the discharge time), and may be output as the respective time information $T_{out}$.

The single global counter 441 may count the reference clocks CLK regardless of whether or not the plurality of hold circuits hold, and each hold circuit may operate independently of the other hold circuits. For example, even when the corresponding hold circuit holds the time information corresponding to the respective time instants at which the respective count end signals are received, the single global counter 441 may continue to count the reference clocks CLK.

As shown in FIG. 5, each of the plurality of hold circuits may be configured as a flip-flop circuit. The single global counter 441 may receive the reference clocks (e.g., clock cycles) from a clock generator 544 and count the number of reference clocks in response to a start signal START. In response to count end signals STOPs being received from the comparators of the corresponding output lines, each flip-flop circuit may hold the digital value indicating the number of reference clocks counted from the start time instant to the output time instant at which the respective count end signals STOPs are each output. The digital values held by flip-flop circuits 543 may indicate time information $T_{outs}$. The time information $T_{outs}$ may include information indicating the time instants at which the comparison results of the corresponding comparators are output.

Therefore, the plurality of hold circuits in the MAC circuit may independently count the number of reference clocks of the single global counter 441 in parallel. In this example, since the hold circuits are implemented in simple flip-flop structures, the power consumption and the area occupied in the circuit may be minimized. Further, since multiple counters do not need to be arranged for the plurality of output lines, the MAC circuit may be implemented with simpler elements.

For reference, in an example, some operations of a neural network described later with reference to FIG. 13, or another neural network or other machine learning model, may be implemented by the MAC circuit shown in FIG. 5. For example, connection weight values $W_{j,i}$ of the neural network may be stored in resistors corresponding to internal memories. Similar to the above description, a start signal START may be applied to the TDC 340 at a start time instant at which the input signals $b_1$ to $b_m$ are input. The single global counter 441 starts counting in response to the start signal START. Resistance components corresponding to bitwise multiplication (for example, XNOR) operations between the input signals $b_1$ to $b_m$ and the connection weight values $W_{j,i}$ in individual resistors may be determined. The resistance components of the resistors may change depending on whether the input voltage signals are applied and the internal resistance values of the resistors as described above. At the input of the comparators, transient behaviors determined by a combination of a capacitor and a composite resistance corresponding to all the bitwise multiplication operation results may be observed. In response to a target voltage of the capacitor reaching a predetermined reference voltage $V_{ref}$ due to the transient behavior, the comparator may transmit the count end signal STOP to the TDC 340, e.g., signaling a corresponding flip-flop, and the TDC may output a time value as a digital value.

Figure 6:
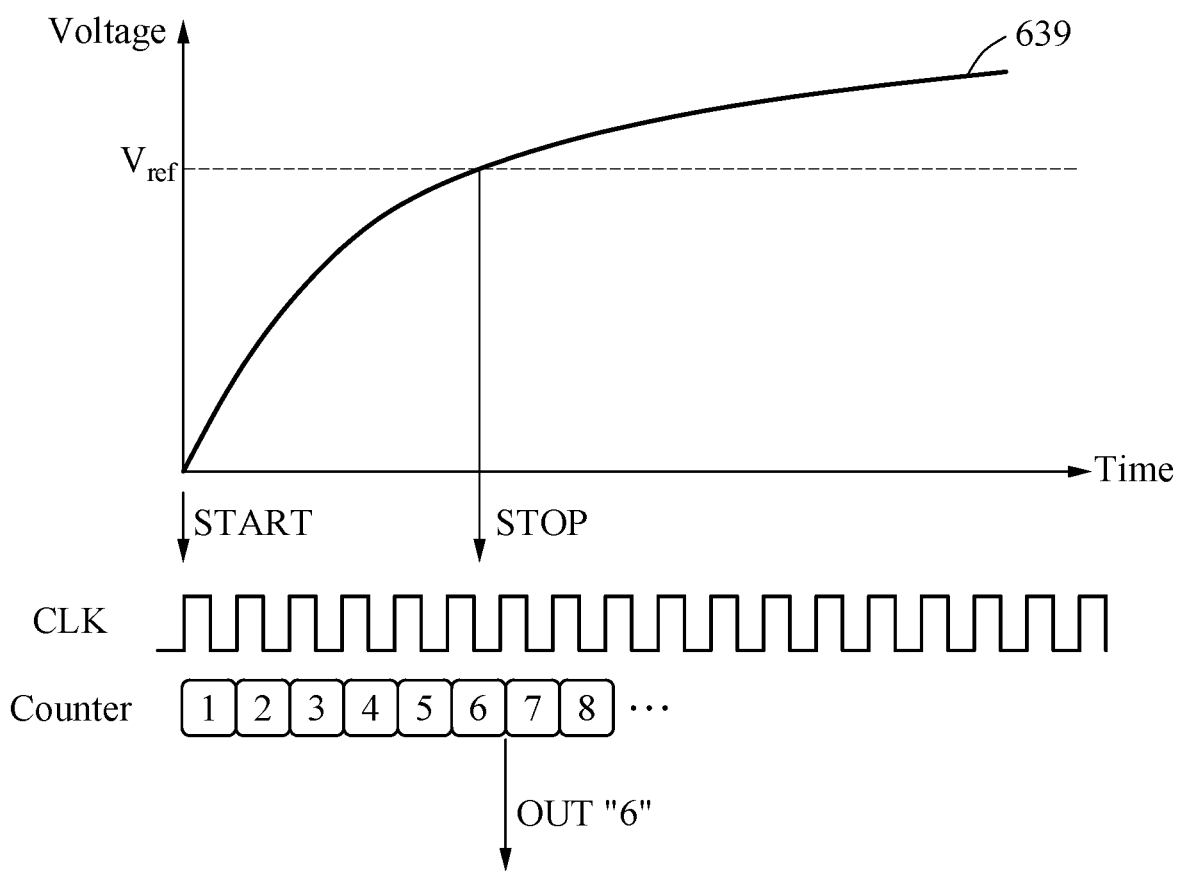
FIG. 6 illustrates an example of a conversion operation of a TDC.

FIG. 6 illustrates an example of a conversion operation of a TDC.

Figure 7:
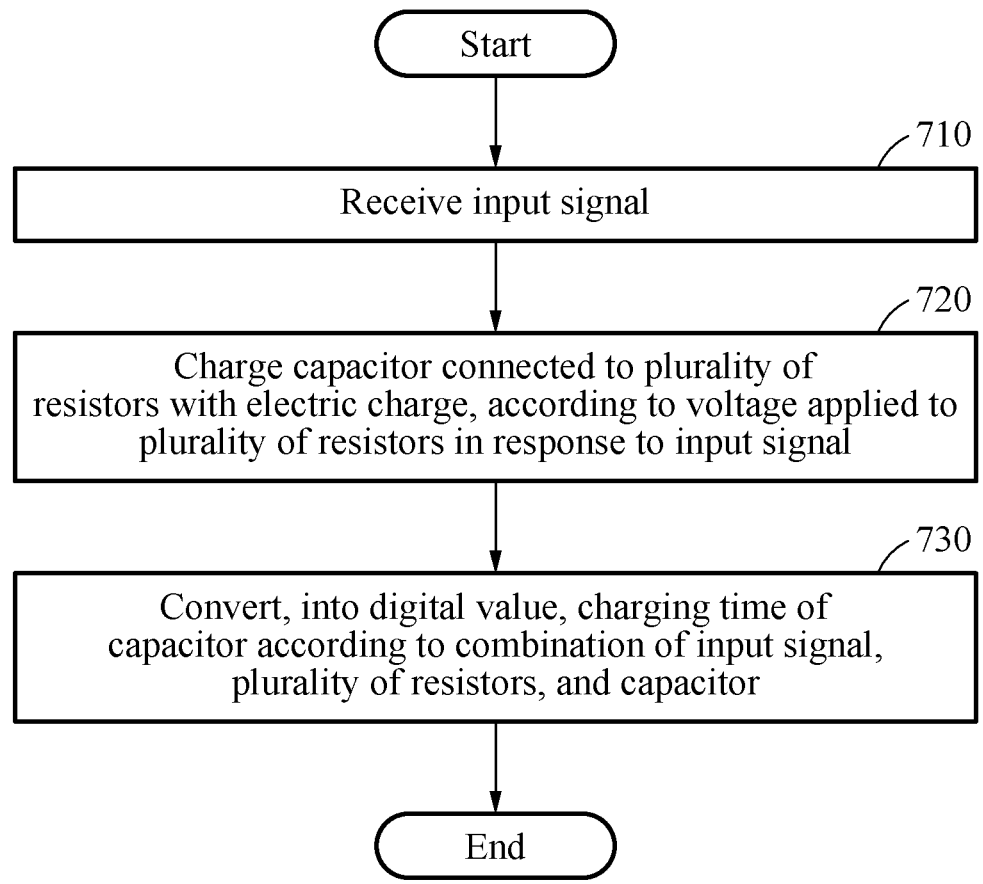
FIG. 7 illustrates an example of a computing method using a MAC circuit of an example computing device.

A target voltage 639 of a capacitor disposed in an output line may gradually increase according to a natural response corresponding to a corresponding time constant of the capacitor, as shown in FIG. 6. That is because electric charge in the capacitor gradually increases. In this example, the clock generator described in FIG. 5 may generate reference clocks, and a single global counter may count the number of reference clocks from a start time instant START. The single global counter may continue to count the number of reference clocks even after an output time instant STOP at which the target voltage 639 becomes equal to the reference voltage $V_{ref}$. A hold circuit of a referrer may hold a digital value indicating the number of reference clocks counted from the start time instant START to the output time instant STOP. For example, in the example of FIG. 6, 6 reference clocks may be generated from the start time instant START to the output time instant STOP, and the hold circuit may output a digital value of FIG. 7 illustrates an example of a computing method using a MAC circuit.

First, in operation 710, a MAC circuit may receive an input signal. For example, the MAC circuit may receive the input signal through individual input lines. As discussed above, depending on the input signal, a voltage may or may not be applied to a resistor for each individual input line.

In operation 720, the MAC circuit may charge, with electric charge, a capacitor connected to a plurality of resistors, according to a voltage applied to the plurality of resistors in response to the input signal.

Subsequently, in operation 730, a TDC may convert, into a digital value, a charging time of the capacitor according to a combination of the input signal, the plurality of resistors, and the capacitor.

Figure 8:
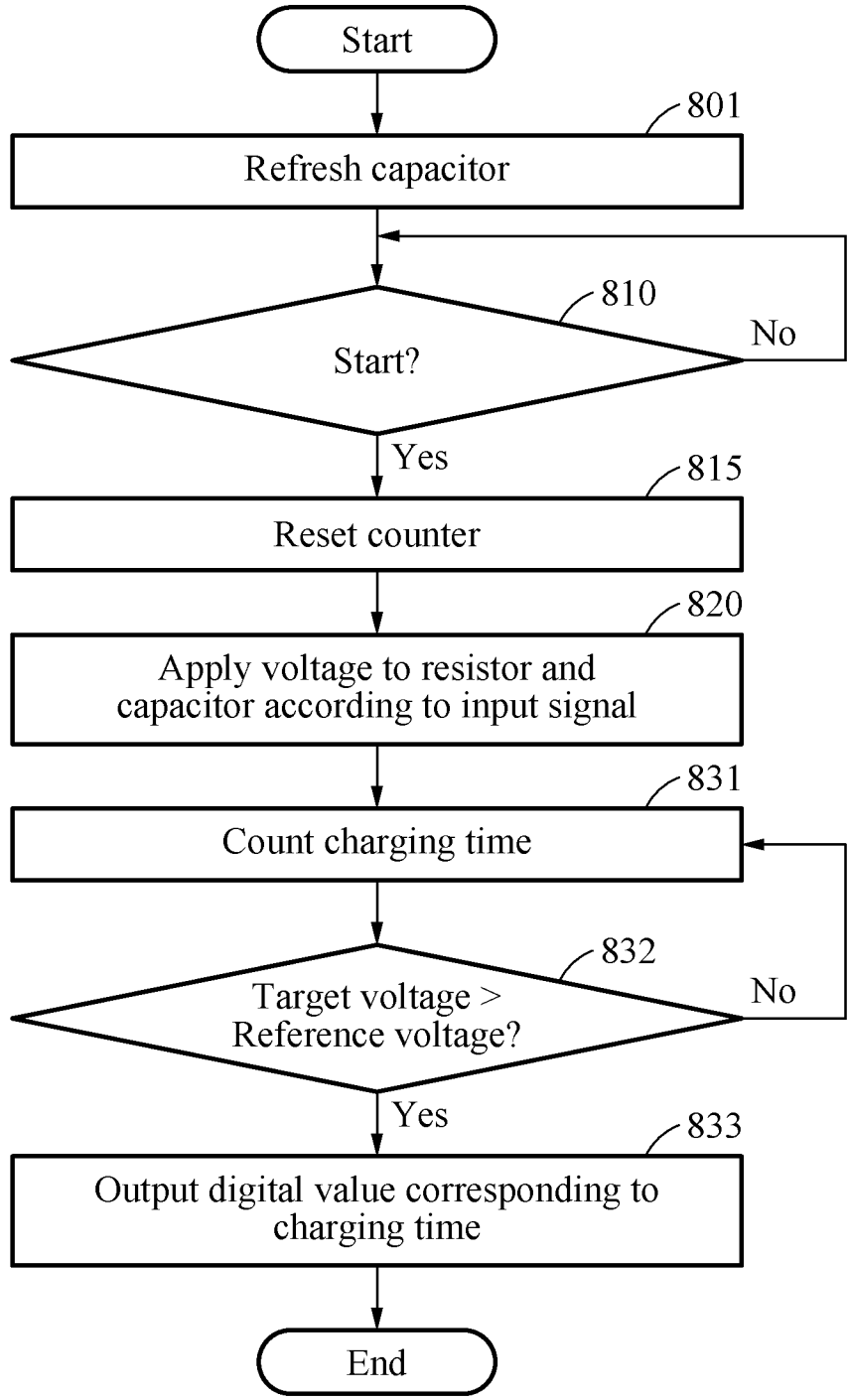
FIG. 8 illustrates an example of a computing method of an example computing device.

FIG. 8 illustrates a detailed example of a computing method.

First, in operation 801, a MAC circuit may refresh a capacitor. For example, the MAC circuit may discharge the capacitor to a threshold voltage or lower until a subsequent input signal is received, e.g., after all output lines have output digital output values with respect to the previous input signal. The MAC circuit may discharge the electric charge from the capacitor until a voltage applied to both ends of the capacitor becomes less than the threshold voltage (for example, 0 volts (V)).

In operation 810, the MAC circuit may determine whether to start a MAC operation. For example, the MAC circuit may perform the following operations in response to a start signal being generated. The MAC circuit may generate the start signal in response to the input signal being received.

In operation 815, a single global counter may reset a count in response to the start signal. For example, the single global counter may reset the number of reference clocks to "0".

In operation 820, the MAC circuit may apply a voltage to a resistor and the capacitor according to the input signal. For example, the MAC circuit may apply the input signal to a resistor corresponding to an input line indicated by input data, among a plurality of resistors, in response to the start signal. When the voltage is applied through the input lines, a target voltage of the capacitor may gradually increase according to a natural response to the applied voltage.

In operation 831, the single global counter may count a charging time. For example, the single global counter may count the number of reference clocks from the start time instant at which the start signal is generated. Thus, a TDC may start counting a time elapsing in response to the start signal.

In operation 832, a comparator may determine whether or when the target voltage of the capacitor exceeds a reference voltage. The comparator may output a comparison result in response to the target voltage exceeding the reference voltage. When the target voltage is less than or equal to the reference voltage, the single global counter continues to count the number of reference clocks, and the single global counter may continue to count the number of reference clocks even after the target voltage exceeds the reference voltage.

In operation 833, the TDC may output a digital value corresponding to the charging time. The TDC may output, as the digital value, the charging time corresponding to time information related to a time elapsing from a start time instant at which the input signal is received to an output time instant at which a comparison result is output.

Figure 9:
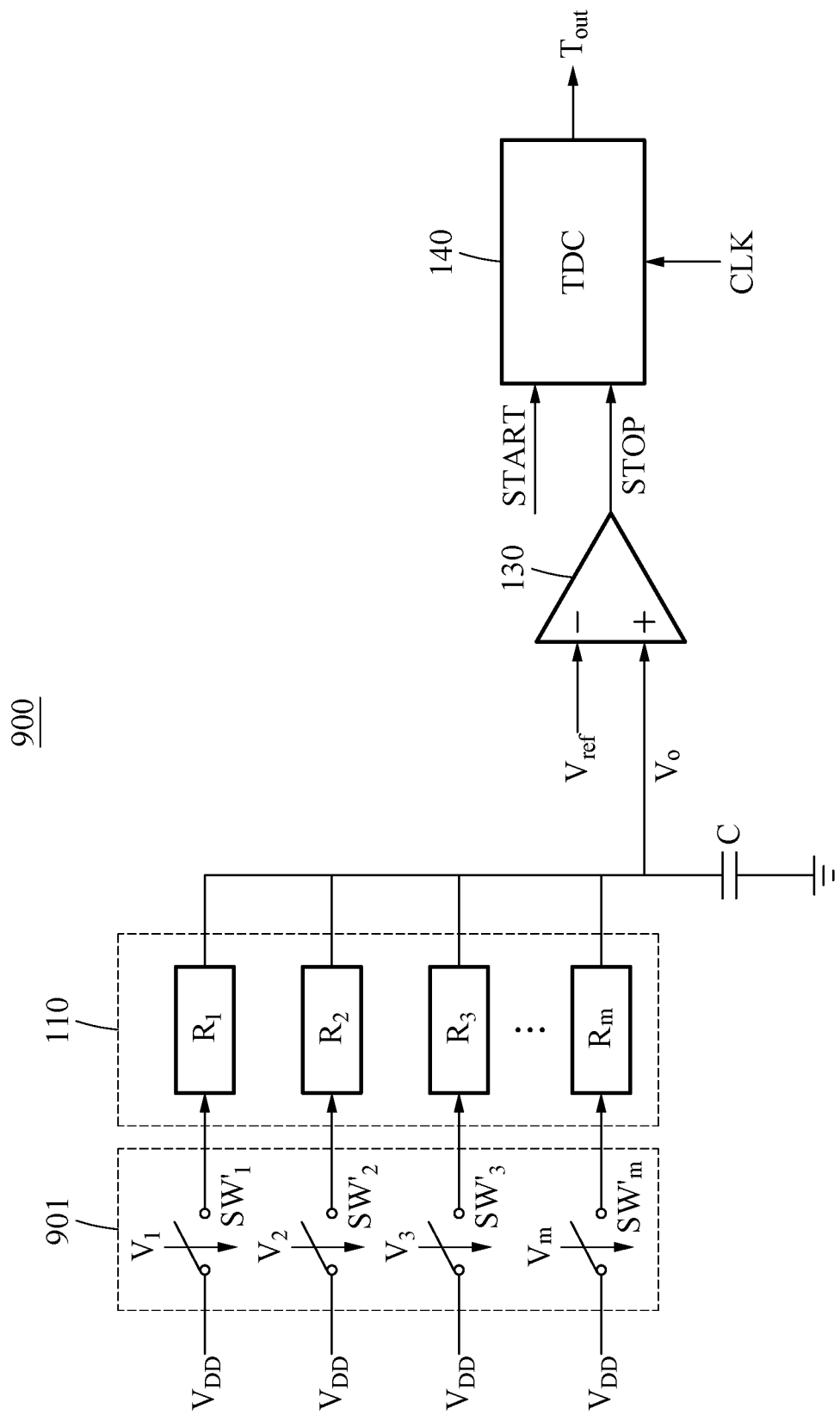
FIG. 9 illustrates an example of a MAC circuit to which a supply voltage is applied by switching.

FIG. 9 illustrates an example of a MAC circuit to which a supply voltage is applied by switching.

A MAC circuit 900 may include switches respectively connected to the plurality of resistors 110. In FIG. 9, $SW'_1$ to $SW'_m$ are a plurality of switches 901 arranged in input lines, respectively.

The plurality of switches 901 may be opened or closed in response to a start signal. The plurality of switches 901 may connect or disconnect a supply voltage $V_{DD}$ and a corresponding resistor based on a switching signal provided, after the start signal is generated. An input voltage signal may be received as the switching signal. When an input voltage signal has a first voltage value corresponding to an ON state, the switch may be thereby turned on and connects the supply voltage $V_{DD}$ with the corresponding resistor. When another input voltage signal has a second voltage value corresponding to an OFF state, the switch may be turned off and disconnect the supply voltage $V_{DD}$ from the corresponding resistor. In an example, the switches may be implemented as respective metal-oxide-semiconductor field-effect transistors (MOSFETs), and each switch may receive a corresponding switching signal at a gate node. For example, each gate node of the respective switches may receive respective input voltage signals. The operation of the switch dependent on the input voltage signal is similar to the above discussions with respect to FIG. 1, e.g., where an input data of an input signal does not include an input voltage signal to be applied to a corresponding input line, an end of a corresponding resistor may float, and the corresponding resistance of the resistor has a substantially great value and thereby has little effect on the composite resistance. In the example of FIG. 9, if input voltage signal has a voltage value corresponding to an OFF state, e.g., a zero voltage value, the switch may be turned off and disconnect, or maintained off and maintain a disconnect, the supply voltage $V_{DD}$ from the corresponding resistor and prevent that resistor from affecting the composite resistance.

Each of the plurality of switches 901 may thereby connect a supply voltage $V_{DD}$ to the corresponding resistor in response to the corresponding input voltage signal being a switch close signal, wherein the input voltage signal is received in an input line in which the resistor connected to the corresponding switch is disposed, and open one end of the corresponding resistor in response to the corresponding input voltage signal being an open switch signal. For example, if a j-th input voltage signal $V_j$ input into a j-th input line is a close signal, a j-th switch $SW'_j$ may connect, or maintain connection of, both ends to transfer a supply voltage $V_{DD}$ received at the other end to a j-th resistor $R_j$ connected to one end, but if the j-th input voltage signal $V_j$ is an open signal, the j-th switch $SW'_j$ may disconnect, or maintain disconnection of, both ends to float one end of the j-th resistor $R_j$.

In addition, when the supply voltage $V_{DD}$ is applied to a resistor, the MAC circuit 900 may operate not only during a charging period but also during a discharging period, which will be described below.

Figure 10:
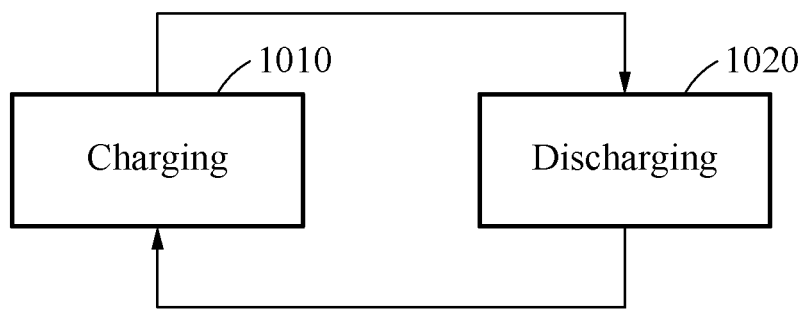
FIGS. 10 through 12 illustrate an example of a charging period operation and a discharging period operation of the MAC circuit of FIG. 9.
Figure 11:
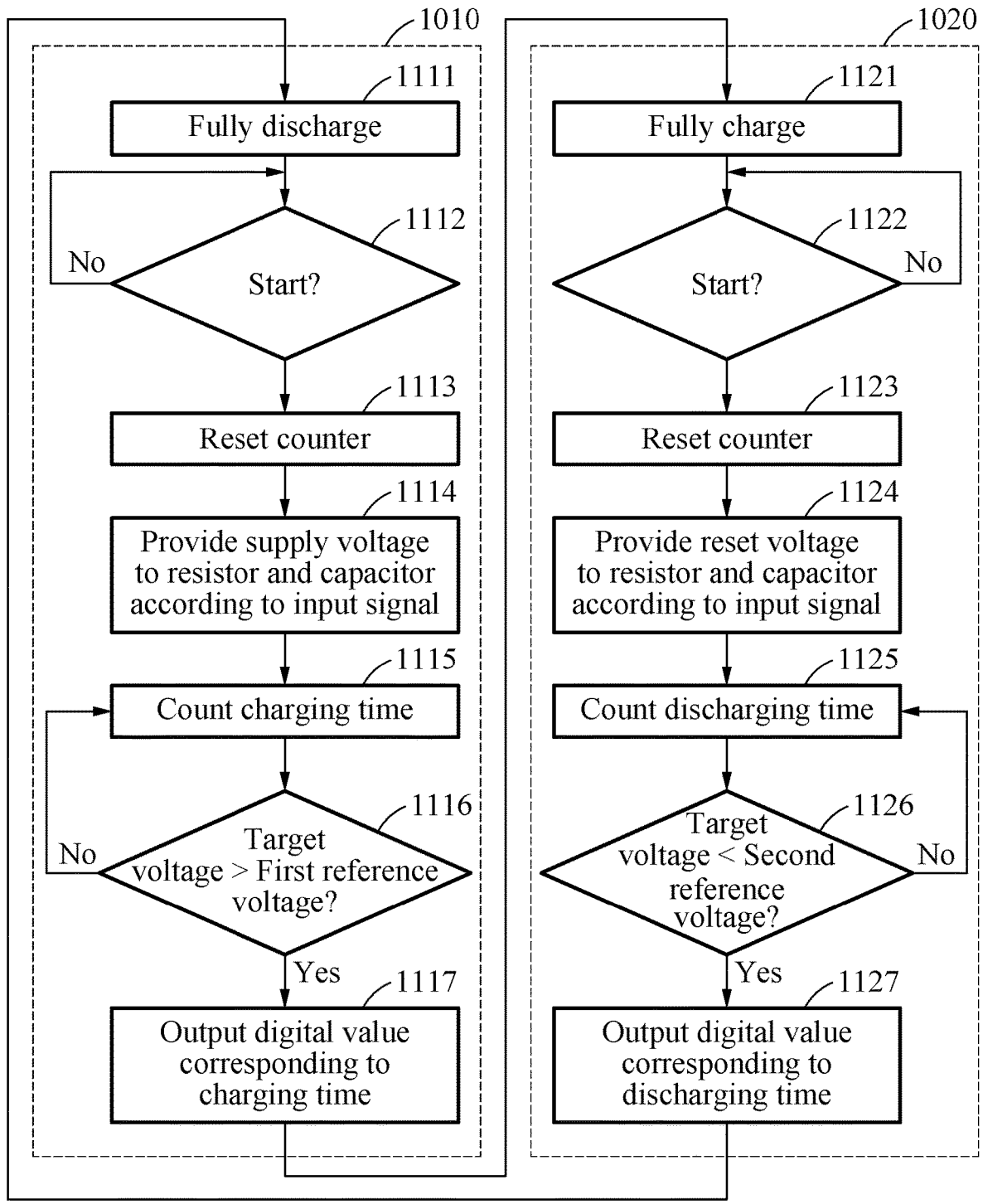
Figure 12:
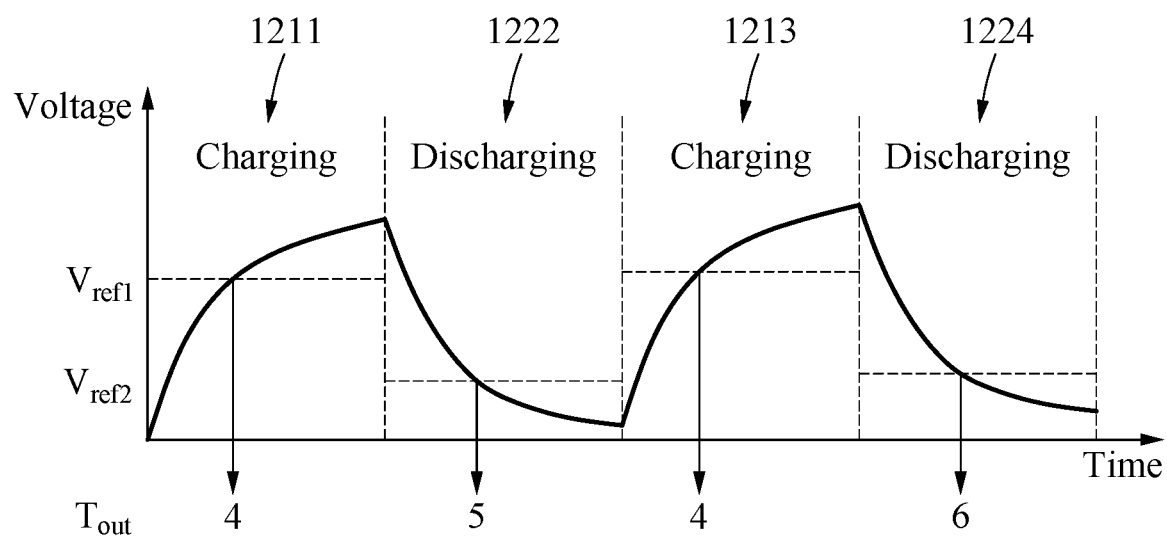

FIGS. 10 through 12 illustrate an example of a charging period operation and a discharging period operation of the MAC circuit of FIG. 9.

In a MAC circuit, there is a limit to a capacitance of a capacitor, and thus the capacitor needs to be discharged after charging. Thus, the MAC circuit may repeat a charging period 1010 and a discharging period 1020, as shown in FIG. 10. Here, the MAC circuit may calculate a MAC result not only during the charging period 1010 but also during the discharging period 1020.

FIG. 11 is a flowchart illustrating a computing method using the MAC circuit in the charging period 1010 and the discharging period 1020.

First, in operation 1111, the MAC circuit may fully discharge a capacitor. For example, the MAC circuit may supply a ground voltage to a resistor connected to the capacitor. Since one end of the capacitor is connected to the resistor and the other end thereof is connected to the ground, the MAC circuit may discharge the capacitor by supplying the ground voltage.

In operation 1112, the MAC circuit may determine whether to start a MAC operation of a charging period. In operation 1113, a single global counter may reset a count in response to a start signal. The details of operations 1112 and 1113 are similar to those of operations 810 and 815 described with reference to FIG. 8, and thus a duplicate description will be omitted.

In operation 1114, the MAC circuit may provide a supply voltage to the resistor and the capacitor according to the input signal. For example, a switch may apply the supply voltage to the resistor connected thereto, in response to an input voltage signal during the charging period. In the MAC circuit shown in FIG. 9, when a j-th input voltage signal input into a j-th input line indicates an ON state, both ends of a j-th switch $SW'_j$ may be connected, e.g., connecting the supply voltage to a j-th resistor $R_j$, or multiple resistors in a same input line, such as discussed above with respect to the provision of voltage to a j-th input line 391 including multiple resistors in FIG. 3. Thus, the supply voltage may be provided to a capacitor C of the corresponding output line through the j-th resistor $R_j$. Conversely, when the j-th input voltage signal input into the j-th input line indicates an OFF state, both ends of the j-th switch $SW'_j$ may be disconnected, and one end of the j-th resistor $R_j$ may float. Thus, among the plurality of resistors, resistors in input lines receiving the ON state may form a composite resistance, and resistors in input lines receiving the OFF state may be excluded from the formation of the composite resistance.

In operation 1115, the single global counter of the MAC circuit may count. When the supply voltage is transferred through the on-state resistor as described above in operation 1114, the capacitor may be charged with electric charge. As the capacitor is charged with electric charge, a target voltage of the capacitor may increase according to the composite resistance formed by the resistors in the ON state and a natural response corresponding to the capacitor. The MAC circuit may count a time for charging the capacitor with electric charge as the number of reference clocks, such as discussed above with respect to FIG. 4.

In operation 1116, a comparator may compare the target voltage to a first reference voltage $V_{ref1}$. The comparator may output a comparison result in response to the target voltage exceeding the first reference voltage $V_{ref1}$ while the capacitor is charged with electric charge by the supply voltage, wherein the target voltage corresponds to the electric charge in the capacitor. When the target voltage reaches the first reference voltage $V_{ref1}$, the single global counter may continue to count the number of reference clocks, e.g., unless all output line comparators have issued stop signals.

In operation 1117, a TDC may output a digital value corresponding to the charging time. For example, the TDC may output, as the charging time, a digital value indicating the number of reference clocks counted from a start time instant to an output time instant at which the comparison result is output in operation 1116 described above. The charging time may be output as a digital code value. The above discussions regarding TDC operations for multiple output lines and multiple TDC outputs with respect to FIGS. 1-8 are also applicable with respect to FIG. 11.

In operation 1121, the MAC circuit may fully charge the capacitor.

In operation 1122, the MAC circuit may determine whether to start a MAC operation of a discharging period. In an example, in operation 1123, the single global counter may reset a count in response to a start signal. The details of operations 1122 and 1123 are similar to those of operations 810 and 815 described with reference to FIG. 8, and thus a duplicate description will be omitted.

In operation 1124, the MAC circuit may provide a reset voltage to the resistor and the capacitor according to the input signal. The reset voltage may correspond to a ground voltage. For example, the switch may apply the reset voltage to the resistor connected thereto, in response to an input voltage signal during the discharging period. In the MAC circuit shown in FIG. 9, when the j-th input voltage signal input into the j-th input line indicates an ON state, both ends of the j-th switch $SW'_j$ may be connected, and the reset voltage (for example, the ground voltage) may be provided to the capacitor C of the corresponding output line through the j-th resistor $R_j$. Conversely, when the j-th input voltage signal input into the j-th input line indicates an OFF state, both ends of the j-th switch $SW'_j$ may be disconnected, and one end of the j-th resistor $R_j$ may float. Therefore, similar to the charging period, in the discharging period, among the plurality of resistors, resistors in input lines receiving the ON state may form a composite resistance, and resistors in input lines receiving the OFF state may be excluded from the formation of the composite resistance.

In operation 1125, the single global counter of the MAC circuit may count a discharging time. When the reset voltage is transferred through the on-state resistor as described above in operation 1124, the electric charge in the capacitor C may be discharged therefrom. As the electric charge is discharged from the capacitor C, the target voltage of the capacitor C may decrease according to the composite resistance formed by the resistors in the ON state and the natural response corresponding to the capacitor C. The MAC circuit may count a time for discharging the electric charge from the capacitor C as the number of reference clocks.

In operation 1126, the comparator may compare the target voltage to a second reference voltage $V_{ref2}$. The comparator may output a comparison result in response to the target voltage according to the electric charge in the capacitor being less than the second reference voltage $V_{ref2}$ while the electric charge is discharged from the capacitor C by the reset voltage. When the target voltage reaches the second reference voltage $V_{ref2}$, the single global counter may continue to count the number of reference clocks, e.g., unless all output line comparators have issued stop signals.

In operation 1127, the TDC may output a digital value corresponding to the discharging time. For example, the TDC may output, as the discharging time, a digital value indicating the number of reference clocks counted from a start time instant to an output time instant at which the comparison result is output in operation 1126 described above. The discharging time may be output as a digital code value.

Referring to the example of FIG. 12, in a first charging period 1211, the comparator may output a comparison result at a time instant at which 4 reference clocks are counted from a start time instant of the corresponding period, and the TDC may output time information $T_{out}$ indicating "4". In a first discharging period 1222, the comparator may output a comparison result at a time instant at which 5 reference clocks are counted from a start time instant of the corresponding period, and the TDC may output time information $T_{out}$ indicating "5". In a second charging period 1213, the comparator may output a comparison result at a time instant at which 4 reference clocks are counted from a start time instant of the corresponding period, and the TDC may output time information $T_{out}$ indicating "4". In a second discharging period 1224, the comparator may output a comparison result at a time instant at which 6 reference clocks are counted from a start time instant of the corresponding period, and the TDC may output time information $T_{out}$ indicating "6".

Accordingly, the MAC circuit may reuse power that could have been wasted as a simple discharge by alternately performing charging and discharging, thereby minimizing power leakage.

Figure 13:
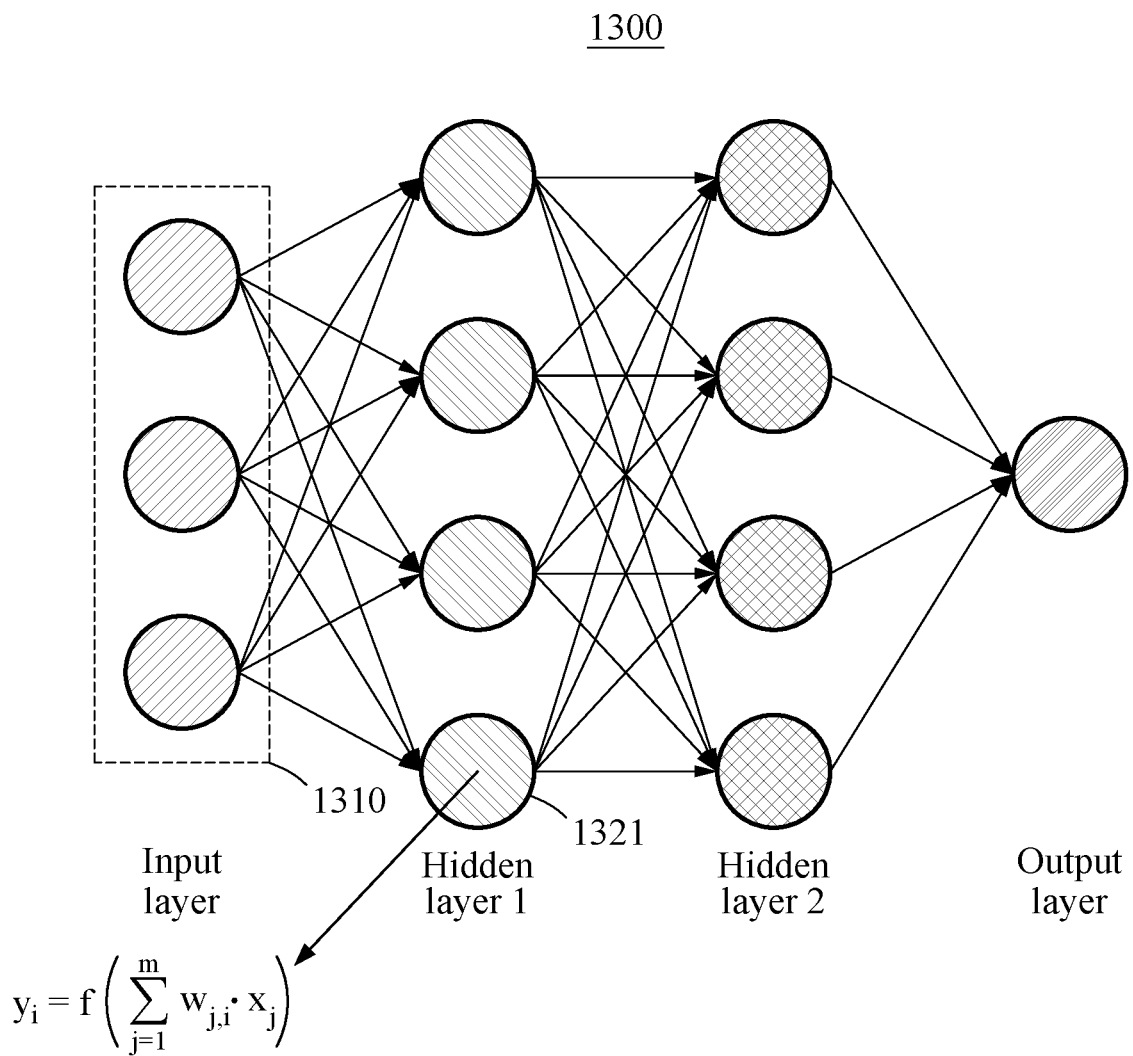
FIG. 13 illustrates an example of a neural network operation implemented by a MAC circuit of an example computing device.

FIG. 13 illustrates an example of a neural network operation implemented by a MAC circuit of a computing device.

A neural network 1300 may be an example of a deep neural network (DNN). The neural network 1300 may be implemented by an example computing device. The DNN may be or include a fully connected network, a deep convolutional network, and a recurrent neural network. The computing device may implement the neural network 1300 to perform object classification, object recognition, speech recognition, and image recognition by mapping input data and output data which are in a non-linear relationship based on deep learning. Deep learning is a machine learning technique for solving problems such as image or speech recognition from a big data set, e.g., through supervised or unsupervised learning, as non-limiting examples.

Although FIG. 13 includes 2 hidden layers for ease of description, various numbers of hidden layers may be included. In addition, although the neural network 1300 is illustrated in FIG. 13 as including a separate input layer 1310 to receive input data, the input data may be input directly into a hidden layer. In the neural network 1300, artificial nodes of the layers other than the output layer may be connected to artificial nodes of a subsequent layer, e.g., as only an example, through links or connections for transmitting output signals. The number of links or connections may correspond to the number of artificial nodes included in the previous layer, the subsequent layer, and the training of the neural network, for example.

The outputs of artificial nodes included in a previous input layer may be input to the respective artificial nodes included in a hidden layer 1 in a weighted form, e.g., through connection weights. The inputs of the weighted form may be referred to as weighted inputs, which are obtained by multiplying weights by the outputs of the artificial nodes included in the previous layer and combining the results. The weights may be referred to as parameters of the neural network 1300. An activation function may be applied to each of the accumulations of the weighted inputs by each node of the hidden layer 1, and each activation of each node in the hidden layer 1 may be output to the subsequent hidden layer 2, for example. The activation function(s) may include one or more of a sigmoid, hyperbolic tangent (tan h), and rectified linear unit (ReLU), and the nonlinearity may be formed in the neural network 1300 by the activation function. Similar operations are performed with respect to the hidden layer 2, where activation outputs of the hidden layer 2 may be input into the respective node(s) included in the output layer.

The MAC circuit described above with reference to FIGS. 1 to 12 may be applied to in-memory computing for driving a deep learning algorithm. For example, as discussed above with respect to FIG. 5, the respective calculations of the weighted inputs transmitted between nodes 1321 of the neural network 1300 may include a MAC operation that repeats the multiplication and accumulation (summation) operations, e.g., in parallel operating MAC circuits and/or in sequential MAC circuit operations. For example, the MAC circuit 300 in FIG. 3 receives a plurality of binary inputs and computes a plurality of binary outputs. In FIGS. 3 and 5, b; denotes a binary value (e.g., a bit value), and this binary value indicates an input value. The number of bits is identical to the number of input values. For the hidden layer 1 of FIG. 13, outputs of the input layer are inputted to each node comprised in the hidden layer 1. In other words, the number of nodes comprised in the input layer corresponds to the number of input values inputted to the node 1321 of the hidden layer 1. If applying the MAC circuit 300 of FIGS. 3 and 5 to implement the neural network 1300 of FIG. 13, then one layer (e.g., the hidden layer 1) of the neural network may be implemented by the aforementioned MAC circuit 300. An output of one predetermined node 1321 of the neural network 1300 may be expressed by Equation 7, for example.

$$y_i = f\left(\sum_{j=1}^{m} w_{j,i} x_j\right) \quad \text{Equation 7}$$

Aforementioned Equation 7 describes a MAC operation of an output line (e.g., i-th output line 392 of FIG. 3) in the MAC circuit 300. In other words, Equation 7 described above may represent an output value $y_i$ of an i-th node 1321 in the hidden layer 1 with respect to m weighted input values input to the hidden layer 1. $x_j$ may denote a j-th output value, e.g., an activation output from a j-th node of the previous layer among the m nodes of the previous layer. $w_{j,i}$ may denote a weight applied to the j-th output value for the link/connection from the j-th node of the previous layer to the i-th node 1321. Thus, $w_{j,i} x_j$ denotes a j-th weighted input among the m weighted input values to the i-th node 1321, and f( ) may denote the activation function of the i-th node 1321 based on a result of all MAC operations for $x_1$ through $x_m$ with respect to weights $w_{1,i}$-$w_{m,i}$ for connections to the i-th node 1321. Thus, as shown in Equation 7, for the activation function, a MAC result of the node value $x_j$ and the weight $w_{j,i}$ may be used. In an example, a memory access operation may be performed to load an appropriate node value $x_j$ and a weight $w_{j,i}$ at a desired time instant and a MAC operation that multiplies and accumulates the same may be repeated. For completing a neural network operation of FIG. 13, operations of the MAC circuit 300 could be repeated for each layer. In other words, the operations of the MAC circuit 300 would be repeated depending on the number of layers of the neural network 1300.

Thus, as a non-limiting example, a plurality of resistors of the MAC circuit may have a set resistance corresponding to a connection weight of an edge connecting a plurality of nodes, e.g., between two layers in the neural network 1300. Input voltage signals provided along the input lines in which the plurality of resistors are disposed may indicate values corresponding to node values $x_j$. Thus, the MAC circuit may perform at least a portion of the operations required to implement the neural network 1300. For reference, in the example MAC circuit, the resistance values of the resistors are not fixed, and may be changed to resistance values corresponding to the connection weight values, e.g., stored in a memory of the computing device as described above and below.

However, the application of the MAC circuit is not limited thereto, and the MAC circuit may be utilized for other or alternate operations of the computing device, to process multiple input data using the characteristic of an analog circuit quickly with low power.

The MAC circuit may have a low-power structure where analog summation and digital conversion circuits of an in-memory computing structure using a TDC are combined. As described above, the MAC circuit may compute multiple column data (for example, data corresponding to the output lines) using one TDC that uses a single global counter. That is because only the count values corresponding to the end signals STOP may be independently referred to for each column or output line since the start signals START are synchronized for the global counter and all input lines. Therefore, in an example, all parallel operations of an entire array in an in-memory example are covered by one TDC. Rather, in existing ADC structure approaches, an ADC is required for each column of a memory array, and a complex structure is required to increase bit precision, and thus, great power and physical area are required. However, an example TDC structure, such as with the MAC circuit described above with respect to FIGS. 1-13, for example, may digitize the accumulation values using a simple single counter and thus, is a simple circuit that may be implemented with less physical area. Further, as an entire array operation may be covered by a single TDC, the power consumption and size may be reduced compared to existing and previous approaches.

Figure 14:
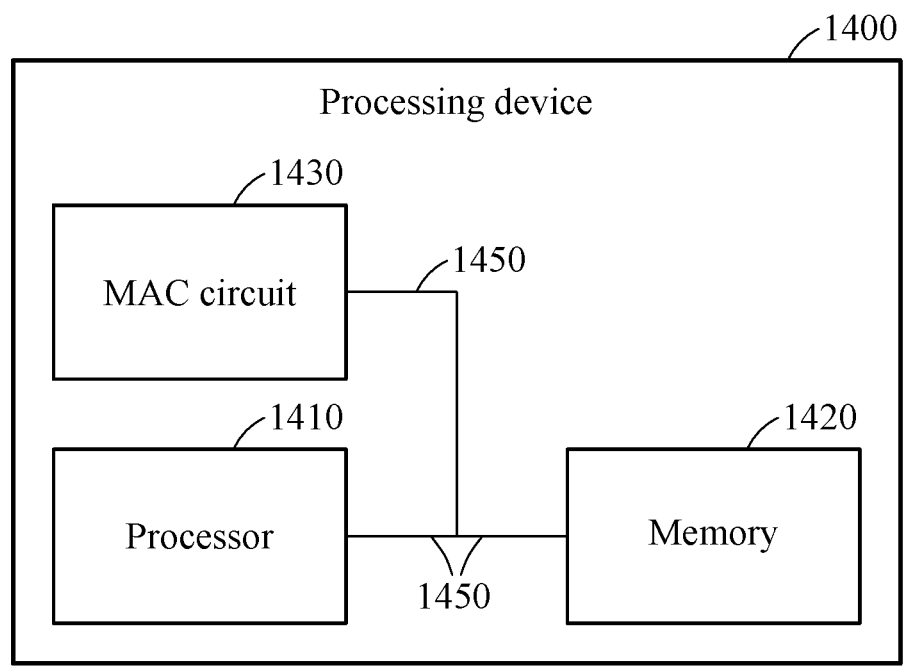
FIG. 14 illustrates an example of a computing device.

FIG. 14 illustrates an example of a computing device. Referring to FIG. 14, a processing device 1400 includes a processor 1410, a memory 1420, a MAC circuit 1430, and a communication bus 1450. The memory 1420 is connected to the processor 1410 and the MAC circuit 1430, e.g., using the communication bus 1450, and stores instructions executable by the processor 1410 as well as parameters of a neural network, data to be computed by the processor 1410 or the MAC circuit 1430, or data processed by the processor 1410 or the MAC circuit 1430. The MAC circuit 1420 may be provided input signal as determined by the processor 1410, for example, with resistor resistance values set based on the parameters stored in the memory 1420, for example, and provide outputs from the MAC circuit 1430 corresponding to the plurality of output lines, as discussed above, for example. In addition, though an example MAC circuit is explained above, the MAC circuit 1430 is representative of plural MAC circuits.

The processor 1410 may execute instructions to control and/or initiate operations of any of the above operations of FIGS. 1-13. For example, the processor 1410 may generate an input data, or receive the input data for an output of a previous layer of a neural network, control provision of the input data to the MAC circuit 1430, and control receipt of output data from the MAC circuit 140. The processor 1410 may further perform such MAC operations and implement one or more neural networks based on stored parameters, and accordingly complete object classification, object recognition, speech recognition, and/or image recognitions for corresponding inputs.

The MAC circuits, switches, resistors, capacitors, comparators, clocks, referrers, TDC, output stage, processors, memories, communication bus, and other apparatuses, units, modules, devices, and other components described herein with respect to FIGS. 1-14 are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-14 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions used herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multiplier-accumulator (MAC) system, comprising:
a MAC circuit, including:
   a plurality of resistors, having respective resistances;
   a capacitor connected to the plurality of resistors to charge, in response to a plurality of input signals, the capacitor with electric charge; and
   a time-to-digital converter (TDC) configured to convert information of a charge time of the capacitor, due to the electric charge, into a digital value,
wherein the digital value is an accumulation result of the MAC circuit.

2. The system of claim 1, wherein the plurality of resistors and the capacitor are configured as a first output line,
wherein the MAC circuit further comprises one or more other output lines, each respectively including respective plural resistors, having respective resistances, connected to a respective other capacitor,
wherein the respective other capacitor, of each of the one or more other output lines, is configured to be charged, in response to the plurality of input signals, with respective electric charge, and
wherein the respective other capacitor and the capacitor have a same capacitance.

3. The system of claim 2, wherein the time-to-digital converter (TDC) is configured to convert respective information of respective charge times of the respective other capacitor of the one or more other output lines, into respective digital values, and
wherein the digital value and the respective digital values are the accumulation results of the MAC circuit.

4. The system of claim 3, wherein the first output line further includes a comparator connected to the capacitor and configured to generate the information of the charge time of the capacitor, and
wherein the other output lines each further include respective other comparators, each of the respective other comparators being respectively connected to the respective other capacitor of the one or more other output lines and configured to generate the respective information of the respective charge times.

5. The system of claim 4, wherein the information of the charge time of the capacitor is an indication of a time instant at which the comparator outputs a comparison result, and wherein the respective information of the respective charge times are each respective indications of the time instances at which the respective other comparators output their respective comparison results.

6. The system of claim 5, wherein the TDC includes a counter configured to generate a count output, the conversion to the digital value is dependent on a corresponding counted output of the counter at a time corresponding to the time instant at which the comparator outputs the comparison result, and the conversions to the respective digital values are respectively dependent on correspondingly counted outputs of the counter at times corresponding to the time instances at which the respective other comparators individually output their respective comparison results.

7. The system of claim 6, wherein the comparator is configured to output the comparison result in response to a voltage of the capacitor meeting a reference threshold, and wherein the respective other comparators each are configured to individually output their respective comparison results in response to respective voltages of the respective other capacitor of the one or more other output lines meeting the reference voltage.

8. The system of claim 4, wherein the comparator is configured to output the comparison result in response to a voltage of the capacitor meeting a reference threshold, and wherein the respective other comparators each are configured to individually output their respective comparison results in response to respective voltages of the respective other capacitor of the one or more other output lines meeting the reference voltage.

9. The system of claim 3, comprising a computing device that includes the MAC circuit, wherein the plurality of input signals are an input to a neural network layer, of the MAC system, as bits of an input or as multi-bit states of respective inputs, and the respective resistances and the other resistances represent at least a parameter of the neural network layer.

10. The system of claim 2, wherein the plurality of input signals are received by the MAC circuit as a series of input voltage signals that are respectively provided to a plurality of input lines of the MAC circuit, wherein, as a first input line of the plurality of input lines, a voltage corresponding to one of the plurality of input signals is provided to one of the plurality of resistors of the first output line, and to one of the respective plural resistors of another output line of the one or more output lines, and wherein, as a second input line of the plurality of input lines, a voltage corresponding to different one of the plurality of input signals is provided to a different one of the plurality of resistors of the first output line, and to a different one of the respective plural resistors of the other output line.

11. The system of claim 1, wherein the MAC circuit further comprises:

a comparator connected to the plurality of resistors and the capacitor and configured to output a comparison result obtained by comparing a target voltage, corresponding to an amount of electric charge in the capacitor, to a reference voltage, wherein the TDC is configured to perform the conversion based on the comparison result of the comparator.

12. The system of claim 11, wherein the information of the charge time of the capacitor includes information indicating a time instant at which the comparison result is output.

13. The system of claim 12, wherein the comparator is configured to output the comparison result, in response to the target voltage exceeding the reference voltage as the capacitor is charged dependent on one or more of the plurality of input signals.

14. The system of claim 1, wherein the plurality of input signals are received by the MAC circuit as a series of input voltage signals that are respectively provided to a plurality of input lines of the MAC circuit.

15. The system of claim 1, wherein the plurality of resistors are connected to each other in parallel, and one end of each of the plurality of resistors is configured to receive a voltage through a switch, and another end of each of the plurality of resistors is connected to the capacitor and a comparator, wherein the information of the charge time of the capacitor is dependent on operation of the comparator.

16. The system of claim 1, wherein one or more resistors of the plurality of resistors form a composite resistance, and the TDC is configured to convert the information of the charge time into the digital value, where the charge time of the capacitor is dependent on a combination of the composite resistance and a capacitance of the capacitor.

17. The system of claim 1, wherein the plurality of resistors and the capacitor are configured as a first output line, and wherein the information of the charge time of the capacitor is a time having elapsed, from a start time instant at which the plurality of input signals are received, to an output time instant at which a comparison result of the first output line is output.

18. The system of claim 17, wherein the TDC comprises:

a single global counter configured to output a value indicating the time having elapsed from the start time instant; and a referrer configured to refer to the output value of the single global counter at the output time instant.

19. The system of claim 18, wherein the plurality of resistors and capacitor are configured as a first output line, of a plurality of output lines of the MAC circuit, that further includes a comparator to provide the information of the charge time of the capacitor, the MAC circuit further comprises one or more other output lines of the plurality of output lines, each respectively including respective plural resistors, having respective resistances, and a respective other capacitor, each of the other output lines including a corresponding other comparator that respectively provides information of charge times of the respective other capacitor, the referrer comprises a hold circuit configured to refer to a comparison result of the comparator, and a plurality of other hold circuits configured to respectively refer to other comparison results of the respective other comparators, and each of the hold circuit and the plurality of other hold circuits are configured to respectively refer to output values of the single global counter at a time instant corresponding to the referred to comparison result and the respectively referred to other comparison results.

20. The system of claim 19, wherein each of the hold circuit and the plurality of other hold circuits is configured as a flip-flop circuit.

21. The system of claim 1, wherein the respective resistances are set to respectively represent a connection weight of an edge, connecting a plurality of nodes, in a neural network of the MAC system.

22. The system of claim 1, wherein the plurality of resistors and the capacitor are configured as a first output line of a plurality of output lines,
wherein the MAC circuit further comprises one or more other output lines, of the plurality of output lines, each respectively including respective plural resistors, having respective resistances, and a respective other capacitor, and
wherein the MAC circuit further comprises an output stage configured to output respective values mapped to digital values generated by the TDC as output values of each of the plurality of output lines.

23. The system of claim 1, wherein the plurality of resistors and the capacitor are configured as a first output line, and
wherein the MAC circuit is configured to discharge the capacitor to a threshold voltage or lower until a subsequent plurality of input signals are received after all digital output values of the TDC are output for all output lines of the MAC circuit with respect to the plurality of input signals.

24. The system of claim 1, wherein the MAC circuit is configured to reset a count of a single global counter, used by the TDC for the conversion, in response to a start signal corresponding to receipt of the plurality of input signals.

25. The system of claim 1, wherein the MAC circuit is configured to apply each of the plurality of input signals to a respective resistor, of the plurality of resistors, corresponding to respective input lines indicated by input data including the plurality of input signals, in response to a start signal, and
the TDC is configured to start counting a time having elapsed in response to the start signal.

26. The system of claim 1, wherein the MAC circuit further comprises:
a switch connected to a select one of the plurality of resistors and configured to transfer an input voltage signal according to an input signal, of the plurality of input signals, to the select one resistor upon receipt of a start signal in response to input data, including the plurality of input signals, indicating a select input line, of a plurality of input lines, that includes the select one resistor.

27. The system of claim 1, wherein the plurality of input signals are respectively provided to a plurality of input lines of the MAC circuit, each including a corresponding resistor of the plurality of resistors, and
wherein the MAC circuit further comprises:
a switch respectively connected to one end of each of the plurality of resistors,
wherein the switch is configured to transfer a supply voltage to the corresponding resistor, in response to a corresponding input signal of the plurality of input signals being a close signal, and configured to open one end of the corresponding resistor, in response to the corresponding input signal being an open signal.

28. The system of claim 27, wherein each of the switches is a MOSFET transistor, with the corresponding input signal connecting to a gate of the MOSFET transistor.

29. The system of claim 1, wherein the MAC circuit further comprises:
a switch connected to a select one of the plurality of resistors and configured to apply a supply voltage to the select one resistor in response to an input signal, of the plurality of input signals, during a charging period of the capacitor.

30. The system of claim 29, wherein the switch is configured to apply a reset voltage to the select one resistor in response to the input signal during a discharging period of the capacitor, and
the MAC circuit further comprises a comparator configured to output a comparison result in response to a target voltage of the capacitor exceeding a first reference voltage while the capacitor is charged with the electric charge by the supply voltage, wherein the target voltage corresponds to the electric charge, and configured to output another comparison result in response to the target voltage being less than a second reference voltage while the electric charge is discharged from the capacitor by the reset voltage.

31. The system of claim 1, wherein the system comprises a computing device, and the MAC circuit is included in the computing device.

32. The system of claim 1, wherein the time-to-digital converter (TDC) is configured to:
convert information of the charge time of the capacitor, with respect to the plurality of input signals input to input lines of the MAC circuit; and
convert information of a discharge time of the capacitor, with respect to a reset voltage being input to the input lines, into another digital value.

33. The system of claim 1, wherein, after the TDC converts the information of the charge time into the digital value, the TDC is reset, and
wherein, for when the reset of the TDC occurs, the TDC is configured to convert information of a discharge time of the capacitor, from at least a charge of the capacitor corresponding to the charging of the capacitor, into another digital value.

34. The system of claim 33, wherein the conversion of the information of the charge time of the capacitor is with respect to the plurality of input signals input being input to input lines of the MAC circuit, and
wherein the TDC is further configured to perform the conversion of the information of the discharge time of the capacitor based on a reset voltage being input to the input lines of the MAC circuit.

35. A multiplier-accumulator (MAC) computing device, comprising:
one or more MAC circuits, respectively including:
a memory array including a plurality of input lines respectively interfacing with a plurality of output lines, where each of the output lines includes a respective capacitor configured to be discharged in response to respective reset signals being selectively provided to two or more of the plurality of input lines; and
a time-to-digital converter (TDC) including a single global counter configured to generate respective output values indicating times having elapsed from a start time instant, the TDC being configured to:

determine select outputs, from the respective output values, at times corresponding to respective discharge times of the respective capacitor with respect to the discharge; and convert each of the determined select outputs into respective digital value results of the MAC circuit for the output lines.

36. A computing method performed by a multiplier-accumulator (MAC) circuit, the computing method comprising:

receiving an input signal;

charging, with electric charge, a capacitor connected to a plurality of resistors, according to a respective voltage applied to the plurality of resistors in response to the input signal; and converting a charging time of the capacitor into a digital value dependent on the input signal, the plurality of resistors, and the capacitor.

37. The MAC computing device of claim 35, wherein the memory array is further configured to charge the capacitor when other input signals are respectively provided to multiple input lines of the plurality of input lines, and wherein the TDC is further configured to generate other respective output values indicating times having elapsed from another start time instant, determine other select outputs, from the other respective output values, at times corresponding to respective charge times of the respective capacitor with respect to the charge, and convert each of the other determined select outputs into other respective digital value results of the MAC circuit.

38. The MAC computing device of claim 37, wherein the other input signals are respective inputs to a neural network layer, of a neural network of the computing device, as bits of an input or as multi-bit states of respective inputs.

39. The MAC computing device of claim 38, wherein the selective provision of the reset signals includes selectively providing the reset signals using switches that operate based on other inputs to the one or more MAC circuits being inputs to a neural network layer, of a neural network of the MAC computing device, as bits of an input or as multi-bit states of respective inputs.

* * * * *